(12) United States Patent
Tsukada et al.

(10) Patent No.: US 11,480,635 B2
(45) Date of Patent: Oct. 25, 2022

(54) TENSION MEASURING METHOD

(71) Applicants: KYOTO UNIVERSITY, Kyoto (JP); TOKYO ROPE MFG. CO., LTD., Tokyo (JP); SUMITOMO ELECTRIC INDUSTRIES, LTD., Osaka (JP)

(72) Inventors: Kazuhiko Tsukada, Kyoto (JP); Toshiyuki Moriya, Chiba (JP); Hiroaki Itoi, Ibaraki (JP); Sadanori Shiiki, Ibaraki (JP); Masashi Oikawa, Osaka (JP); Shinji Nakaue, Osaka (JP)

(73) Assignees: KYOTO UNIVERSITY, Kyoto (JP); TOKYO ROPE MFG. CO., LTD., Tokyo (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 17/446,632

(22) Filed: Sep. 1, 2021

(65) Prior Publication Data

US 2022/0075011 A1    Mar. 10, 2022

(30) Foreign Application Priority Data

Sep. 4, 2020    (JP) .............................. JP2020-148924

(51) Int. Cl.
*G01R 33/14*    (2006.01)
*G01L 5/10*    (2020.01)

(52) U.S. Cl.
CPC ................ *G01R 33/14* (2013.01); *G01L 5/10* (2013.01)

(58) Field of Classification Search
CPC ................ G01R 33/00; G01R 33/0035; G01R 33/0023; G01R 33/0017; G01R 31/3191; G01R 33/14; G01B 7/004; G01C 17/38; G06F 3/017; G06F 3/0346; G06F 3/012; G01L 5/10
See application file for complete search history.

(56) References Cited

U.S. PATENT DOCUMENTS

| | | | | |
|---|---|---|---|---|
| 3,942,369 A | * | 3/1976 | Roggenstein | G01L 1/10 73/862.41 |
| 4,158,962 A | * | 6/1979 | Conoval | G01L 5/042 73/DIG. 1 |
| 4,929,903 A | * | 5/1990 | Saigo | G01R 31/52 324/544 |

FOREIGN PATENT DOCUMENTS

| | | |
|---|---|---|
| JP | H09-101289 | 4/1997 |
| JP | 2003-270059 | 9/2003 |

* cited by examiner

*Primary Examiner* — Jermele M Hollington
*Assistant Examiner* — Taqi R Nasir
(74) *Attorney, Agent, or Firm* — IPUSA, PLLC

(57) ABSTRACT

A tension measuring method installs a reel having a cylindrical coil forming part on a cable to be measured, forms a coil by winding a conductor around the coil forming part, measures a magnetic hysteresis loop of the cable by supplying a current to the coil to generate a magnetic field, and computes a tension of the cable using a parameter determined from the hysteresis loop. A magnetic field sensor and a magnetic flux sensor are provided inside a through hole in the coil forming part, and the cable is positioned inside the through hole. The magnetic field is varied so that the hysteresis loop includes a near-saturation magnetization region, to measure the hysteresis loop using the sensors. The parameter is selected from a magnetic flux or a magnetic flux density, a remanent magnetization, a coercivity, a magnetic permeability, and a hysteresis loss in the near-saturation magnetization region.

6 Claims, 15 Drawing Sheets

TENSION MEASURING METHOD

CROSS-REFERENCE TO RELATED APPLICATIONS

This application is based upon and claims priority to Japanese Patent Application No. 2020-148924 filed on Sep. 4, 2020, the entire contents of which are incorporated herein by reference.

BACKGROUND OF THE INVENTION

1. Field of the Invention

The present disclosure relates to tension measuring methods.

2. Description of the Related Art

Japanese Laid-Open Patent Publication No. 9-101289 proposes an example of a method of measuring bending stiffness and tension of a cable. A shock is applied to the cable under tension, to detect vibration at an arbitrary point of the cable, and the detected vibration is subjected to frequency analysis. The bending stiffness and tension of the cable are determined from a relationship which stands between a plurality of natural frequencies obtained from the frequency analysis result, and the order of the natural frequencies.

Japanese Laid-Open Patent Publication No. 2003-270059 proposes an example of a system for measuring a current stress of a reinforcing steel bar in a reinforced concrete structure, using a stress measurement sensor which utilizes a magnetic permeability of steel, such as the reinforcing steel bar or the like, sensitive to a change in stress.

Various types of cables, such as a main cable and a hanger rope used in suspension bridges, a diagonal used in cable stayed bridges, prestressed concrete (PC) steel used in prestressed concrete, or the like, are used in buildings. Because these cables support the members of the building or apply stressing force on the members of the building, a suitable tension needs to be applied during and after construction of the building. For this reason, it is conventionally required to measure the tension of the cable during the construction of the cable or at an arbitrary timing after the construction of the cable, for the purpose of construction management and inspection of the building.

As proposed in Japanese Laid-Open Patent Publication No. 9-101289, a vibration method is often used for measuring the tension of the cable erected on a bridge or the like. However, the vibration method cannot accurately determine the tension in cases where the length of the cable is short, the cable includes bends or junctions in the middle, or a fixing point is uncertain due to the presence of various attachments on the cable or at a terminal end of the cable.

The stress measurement sensor proposed in Japanese Laid-Open Patent Publication No. 2003-270059 includes a hollow member which is formed to a cylindrical shape with a hollow portion fitted with the reinforced steel bar of the reinforced concrete structure to be measured, a secondary coil which is wound around an inner circumference of the hollow member, a primary coil which is wound around an outer circumference of the hollow member, and a thermometer which detects the temperature of the reinforced steel bar. A pulse current is applied to the primary coil, an induced current value is detected through the secondary coil, and the stress is computed using the magnetic permeability or the temperature computed from the induced current value.

However, when the stress measurement sensor proposed in Japanese Laid-Open Patent Publication No. 2003-270059 is applied to the cable, excitation by the pulse current inevitably generates an eddy current inside the cable. In the cable having a stranded wire structure, the flow of the eddy current generated by the excitation is complex, and is not always constant.

Furthermore, when the pulse current is used to excite the cable, the magnetization of the cable cannot be made sufficiently strong to the inside of the cable. For this reason, the magnetic permeability used for evaluating the tension is affected by the magnetic history or stress history (remanent magnetization) applied to the cable in the past.

Accordingly, when the stress measurement sensor proposed in Japanese Laid-Open Patent Publication No. 2003-270059 is applied to the tension measurement of the cable, it may be regarded that the tension cannot be evaluated in a reproducible manner depending on the erected state or the like.

Hence, there are demands for a new tension measuring method, other than the vibration method, which can measure the tension acting on the cable.

SUMMARY OF THE INVENTION

One object of the present disclosure is to provide a novel tension measuring method for measuring the tension acting on the cable.

According to one aspect of the present disclosure, a tension measuring method for measuring a tension of a cable, includes installing a tension measuring reel having a cylindrical solenoid coil forming part on the cable to be measured; forming a first coil by winding a conductor around the solenoid coil forming part to form a first coil; measuring a magnetic hysteresis loop of the cable by supplying a current to the first coil to generate a magnetic field; and computing the tension of the cable using a parameter determined from the magnetic hysteresis loop, wherein the solenoid coil forming part has a first through hole along a center axis thereof, wherein a magnetic field sensor and a magnetic flux sensor are provided inside the first through hole, wherein the installing installs the tension measuring reel on the cable so that the cable is positioned inside the first through hole, wherein the measuring varies the magnetic field so that the magnetic hysteresis loop includes a near-saturation magnetization region, to measure the magnetic hysteresis loop using the magnetic field sensor and the magnetic flux sensor, and wherein the parameter used by the computing is one or more parameters selected from a group consisting of a magnetic flux or a magnetic flux density, a remanent magnetization, a coercivity, a magnetic permeability, and a hysteresis loss in the near-saturation magnetization region.

Other objects and further features of the present disclosure will be apparent from the following detailed description when read in conjunction with the accompanying drawings.

DESCRIPTION OF THE EMBODIMENTS

Figure 1:
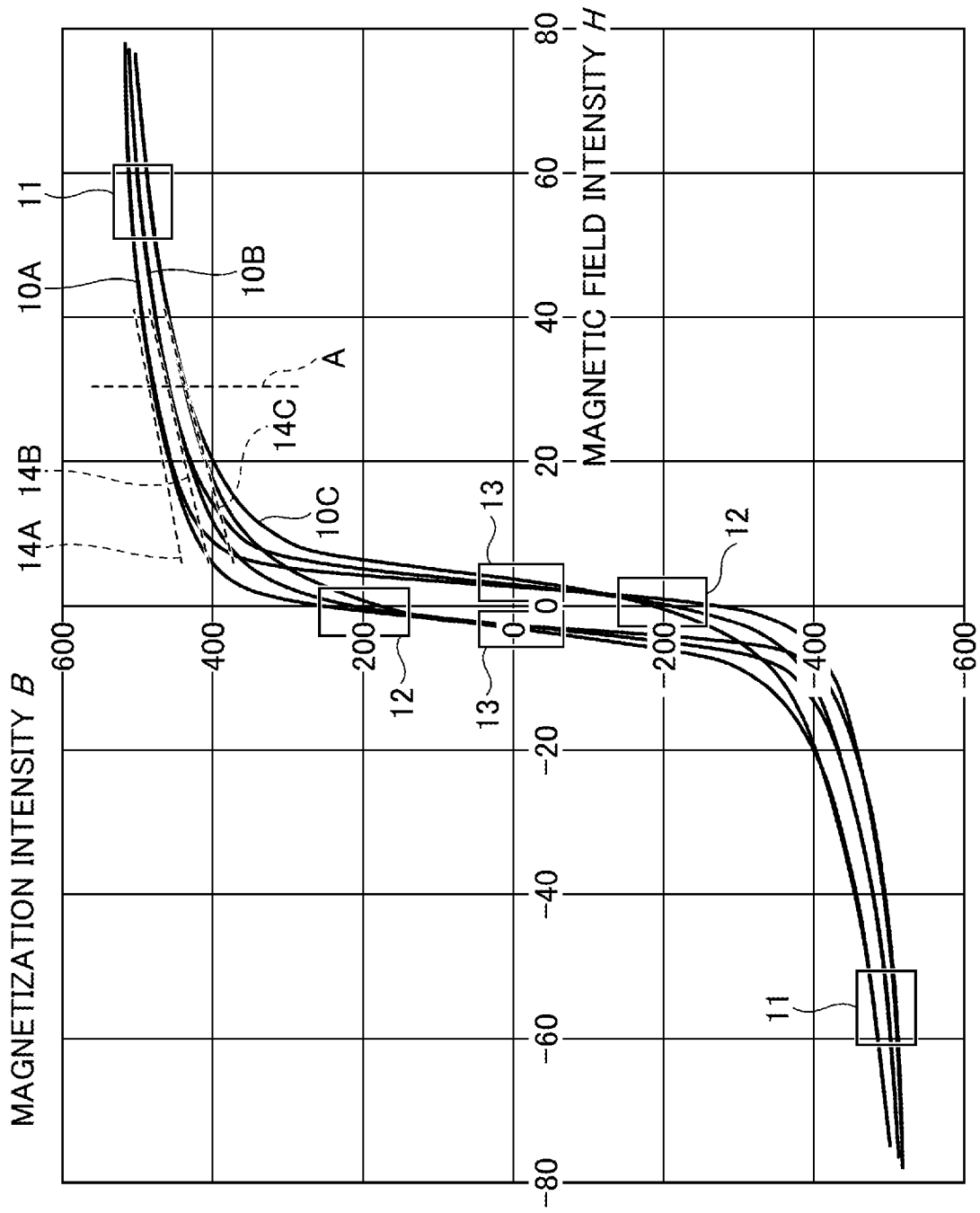
FIG. 1 is a diagram for explaining a variation in a magnetic hysteresis loop when a tension applied to a cable is varied.

Embodiments of the present disclosure will be described in the following. In the following description, the same or corresponding elements are designated by the same reference numerals, and a description of the same or corresponding elements will be omitted.

A tension measuring method for measuring a tension of a cable, according to one aspect of the present disclosure, includes installing a tension measuring reel having a cylindrical solenoid coil forming part on the cable to be measured;

forming a first coil by winding a conductor around the solenoid coil forming part to form a first coil;

measuring a magnetic hysteresis loop of the cable by supplying a current to the first coil to generate a magnetic field; and computing the tension of the cable using a parameter determined from the magnetic hysteresis loop, wherein the solenoid coil forming part has a first through hole along a center axis thereof, wherein a magnetic field sensor and a magnetic flux sensor are provided inside the first through hole, wherein the installing installs the tension measuring reel on the cable so that the cable is positioned inside the first through hole, wherein the measuring varies the magnetic field so that the magnetic hysteresis loop includes a near-saturation magnetization region, to measure the magnetic hysteresis loop using the magnetic field sensor and the magnetic flux sensor, and wherein the parameter used by the computing is one or more parameters selected from a group consisting of a magnetic flux or a magnetic flux density, a remanent magnetization, a coercivity, a magnetic permeability, and a hysteresis loss in the near-saturation magnetization region.

The tension measuring method according to this one aspect of the present disclosure can generate a uniform and stable magnetic field around the cable, which is a measuring target, using a solenoid type magnetizer. It is possible to provide a novel tension measuring method which can accurately measure the tension acting on the cable, using one or more parameters selected from the magnetic flux or the magnetic flux density, the remanent magnetization, the coercivity, the magnetic permeability, the hysteresis loss, or the like in the near-saturation magnetization region, which have a strong correlation to the tension of the cable.

In the tension measuring method, the tension measuring reel may be divisible into a plurality of members along a circumferential direction of the first through hole, and the installing may dispose the plurality of members of the tension measuring reel along a circumferential direction of the cable.

By dividing the tension measuring reel into the plurality of members, the tension measuring reel may be installed on an existing cable, and an enable measurement of the tension of the existing cable.

Details of Embodiments of Present Disclosure

A tension measuring method according to one embodiment of the present disclosure (hereinafter also referred to as "this embodiment") will be described, by referring to the drawings. The present invention is not limited to the disclosed embodiments, and various variations and modifications may be made without departing from the meaning and scope of the present disclosure.

The present inventors conducted diligent studies on a novel tension measuring method which can measure a tension acting on a cable.

Various types of cables, such as a main cable and a hanger rope used in suspension bridges, a diagonal used in cable stayed bridges, prestressed concrete (PC) steel used in prestressed concrete, or the like, use various kinds of metals so as to withstand a tension applied thereto. Examples of the various kinds of metals include ferromagnetic materials, such as steel or the like. The Villary effect (or stress magnetic effect) occurs in the ferromagnetic materials. According to the Villary effect, which is a stress magnetic effect, a magnetization state or a magnetic susceptibility of the material varies when a stress is applied to the material.

FIG. 1 illustrates a variation in a magnetic hysteresis loop (hereinafter simply referred to as "hysteresis loop") when the tension applied to the cable is varied. In FIG. 1, the abscissa indicates a magnetic field intensity, and the ordinate indicates a magnetization intensity inside the cable, corresponding to a magnetic flux and a magnetic flux density inside the cable.

FIG. 1 illustrates a hysteresis loop 10A for a case where a tension of 1000 kN is applied, a hysteresis loop 10B for a case where a tension of 2000 kN is applied, and a hysteresis loop 10C for a case where a tension of 3000 kN is applied, with respect to a steel wire, as the cable. As illustrated in FIG. 1, it is possible to confirm that the magnetization intensity generated in the cable varies according to the tension applied to the cable, even with respect to the same cable, and that the cable displays the Villary effect.

Three methods are conceivable for evaluating the tension of the cable using the Villary effect.

From the hysteresis loops illustrated in FIG. 1, it is possible to confirm that the magnetic flux and the magnetic flux density vary according to the tension applied to the cable, at points in a closed region of each of the hysteresis loops, for example. In addition, it is possible to confirm that a remanent magnetization and a coercivity, at points on each of the hysteresis loops, also vary according to the tension applied to the cable.

For this reason, as a first method of evaluating the tension of the cable, it is conceivable to compute the tension of the cable using a specific point on the hysteresis loop. More particularly, a method of measuring the magnetic flux or the magnetic flux density at a certain magnetic field intensity when the cable is magnetized to a near-saturation magnetization region 11 in FIG. 1, and computing the tension applied to the cable, is conceivable. The near-saturation magnetization region refers to a region in which a magnetization curve follows the same curve when the magnetic field increases or decreases, that is, a region where the hysteresis loop is closed. A method of measuring the remanent magnetization in a region 12 and the coercivity in a region 13, and computing the tension applied to the cable, is also conceivable.

It is also possible to confirm from the hysteresis loop illustrated in FIG. 1 that a slope of the points on the hysteresis loop, that is, a magnetic permeability, varies according to the tension applied to the cable. More particularly, it is possible to confirm that the slopes of tangential lines 14A, 14B, and 14C of each of the hysteresis loops 10A, 10B, and 10C, at intersections with a straight line A indicating a specific magnetic field intensity, are different. For this reason, as a second method of evaluating the tension of the cable, it is conceivable to determine the slope of the curve at a specific point (or position) on the hysteresis loop, that is, the magnetic permeability, and compute the tension applied to the cable.

An area of the hysteresis loop also varies according to the tension applied to the cable. Further, a hysteresis loss is proportional to the area of the hysteresis loop. For this reason, as a third method of evaluating the tension of the cable, it is conceivable to determine the hysteresis loss proportional to the area of the hysteresis loop, and compute the tension applied to the cable.

The magnetization state of the cable does not extend beyond the hysteresis loop which is obtained by repeating strong positive and negative magnetizations up to the near-saturation magnetization region. For this reason, the magnetic flux or the magnetic flux density, the remanent magnetization, the coercivity, the magnetic permeability, and the hysteresis loss at a certain magnetic field intensity, such as the near-saturation magnetization region or the like, on the hysteresis loop which is obtained by repeating the strong positive and negative magnetizations so as to include the near-saturation magnetization region, are not affected by the magnetic history of the cable. Accordingly, by computing the tension of the cable using the magnetic flux or the like, it is possible to accurately compute the tension of the cable regardless of the magnetic history of the cable.

In the case of the second method using the slope of the hysteresis loop, it is preferable to apply a magnetic field with a gradual change that does not generate an eddy current, without using an AC magnetic field or a variable magnetic field accompanying an abrupt change which is likely to generate the eddy current. If the AC magnetic field or the variable magnetic field accompanying the abrupt change is applied to the cable in order to measure the slope of the hysteresis loop, the eddy current is generated in the cable so as to prevent the magnetic field from changing. Generally, the cable has the stranded wire structure including a plurality of stranded wires, and thus, if the AC magnetic field or the like accompanying the abrupt change is applied to the cable, the eddy current is generated even at a part where the wires make contact with each other. However, because a contact state of the wires is not necessarily uniform along a longitudinal direction (or a length direction) of the cable, it is preferable not to use the AC magnetic field or the variable magnetic field accompanying the abrupt change.

As described above, the present inventors found that the tension acting on the cable can be measured by utilizing a phenomenon in which the magnetic flux or the magnetic flux density, the remanent magnetization, the coercivity, the magnetic permeability, and the hysteresis loss of the hysteresis loop, obtained by varying the magnetic field so as to include the near-saturation magnetization region, vary according to the tension applied to the cable. In addition, it was found that the tension of the cable can be accurately measured by this method of measuring the tension acting on the cable.

Because the tension measuring method according to this embodiment measures the tension of the cable by the method described above, the present inventors conducted further studies on methods of forming a predetermined magnetic field around a measuring target, which is the cable to be measured in this example.

It is conceivable to use a permanent magnet for generating the magnetic field, because a configuration of the device can be made simple and the device does not require a power supply. However, if the permanent magnet is used, the magnetic field intensity varies greatly depending on a distance from the magnet, thereby making it difficult to generate a uniform and stable magnetic field around the cable. In addition, if the permanent magnet is used for generating the magnetic field, the magnetic field intensity cannot be varied. For this reason, depending on the type, size, and number of cables to be measured, it may not be possible to apply a magnetic field reaching the near-saturation magnetization region, for example. Further, because the magnetic field intensity cannot be varied, the same device cannot be used to measure the remanent magnetization, the coercivity, and the hysteresis loss.

On the other hand, when a solenoid type magnetizer is used for generating the magnetic field, it is possible to form a uniform and stable magnetic field in a region surrounded by a coil of the solenoid type magnetizer. In addition, by adjusting a current value supplied to the coil of the solenoid type magnetizer, it is possible to control the magnetic field intensity, and generate a magnetic field which reaches the near-saturation magnetization region of the cable. Further, the remanent magnetization, the coercivity, or the like can be measured using the same device by varying the magnetic field intensity.

Based on results of the studies described above, the present inventors found that the magnetic field, reaching the near-saturation magnetization region of the cable, can be generated by the solenoid type magnetizer around the cable to be measured, and the tension applied to the cable can be determined in a reproducible manner from the magnetic flux, the magnetic flux density, or the like in a state where the cable is magnetized by the generated magnetic field.

Examples of the configurations of a tension measuring reel, and a tension measuring device including a tension measuring reel, which may be suitably used for the tension measuring method according to this embodiment, will be described before describing the tension measuring method according to this embodiment.

<Tension Measuring Reel>

As described above, according to the studies conducted by the present inventors, the solenoid type magnetizer is preferably used for generating the magnetic field according to the present inventors. For this reason, the tension measuring device used in the tension measuring method according to this embodiment may include a tension measuring reel, which accommodates the cable to be measured, and form and support a solenoid coil of a solenoid type magnetizer around the cable.

The tension measuring reel according to this embodiment may be disposed on an outer periphery of the cable to be measured. In addition, the tension measuring reel according to this embodiment may include a solenoid coil forming part having a cylindrical shape, and a first through hole.

Hereinafter, the tension measuring reel will be described in more detail, by referring to FIG. 2 through FIG. 6.

Figure 2:
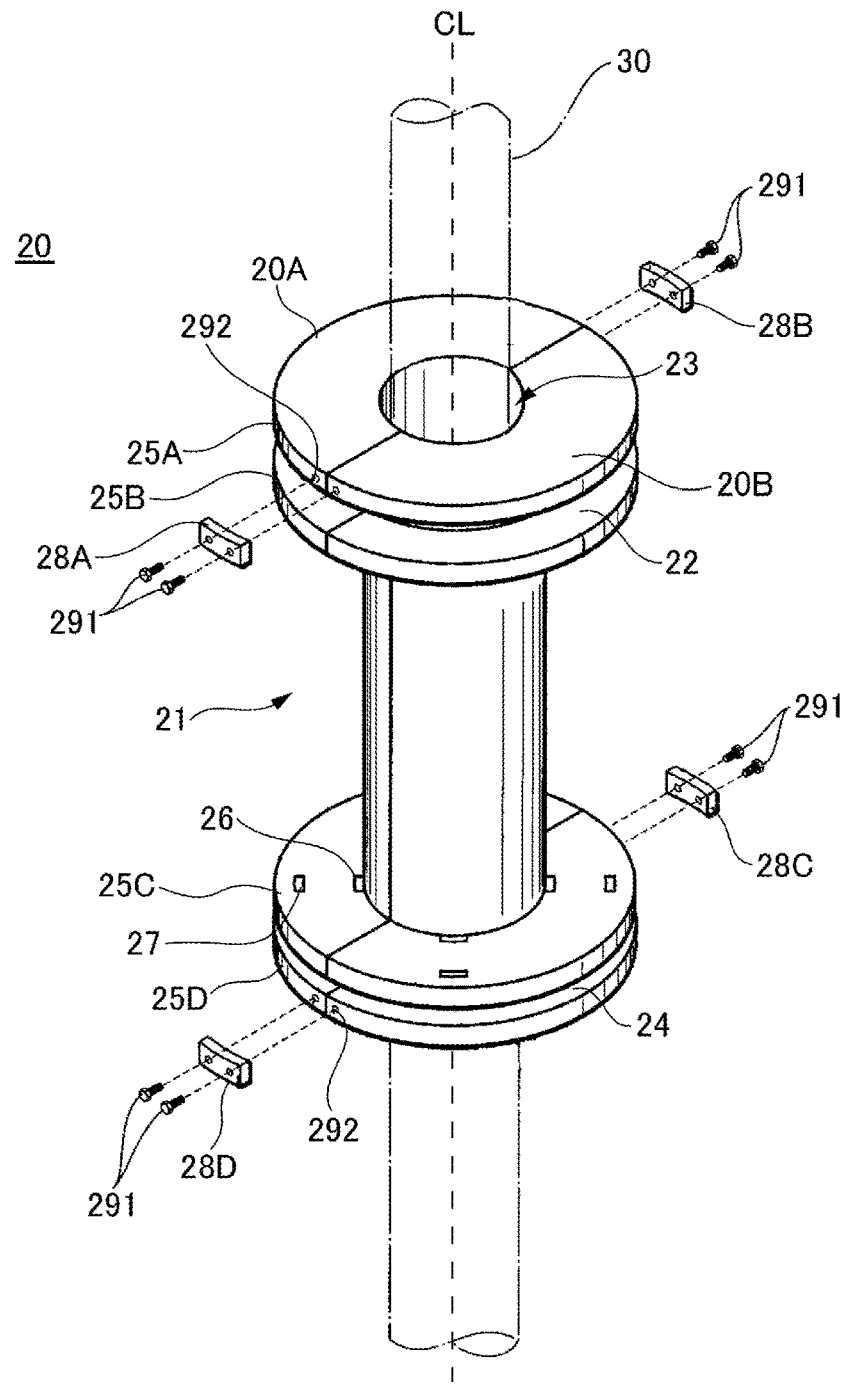
FIG. 2 is a perspective view of a tension measuring reel which may be suitably used in a tension measuring method according to one aspect of the present disclosure.
Figure 3:
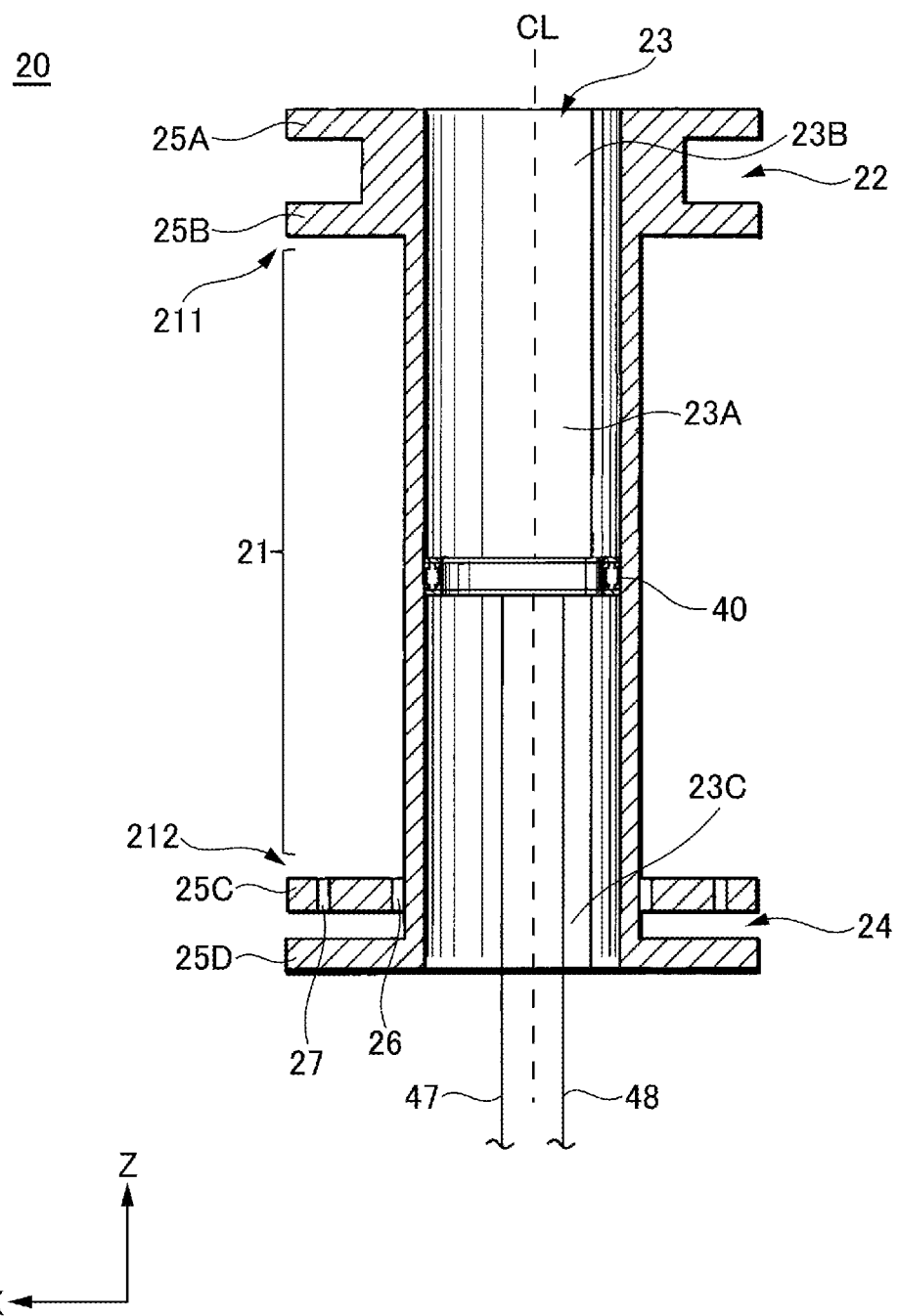
FIG. 3 is a longitudinal view of the tension measuring reel which may be suitably used in the tension measuring method according to one aspect of the present disclosure.
Figure 4:
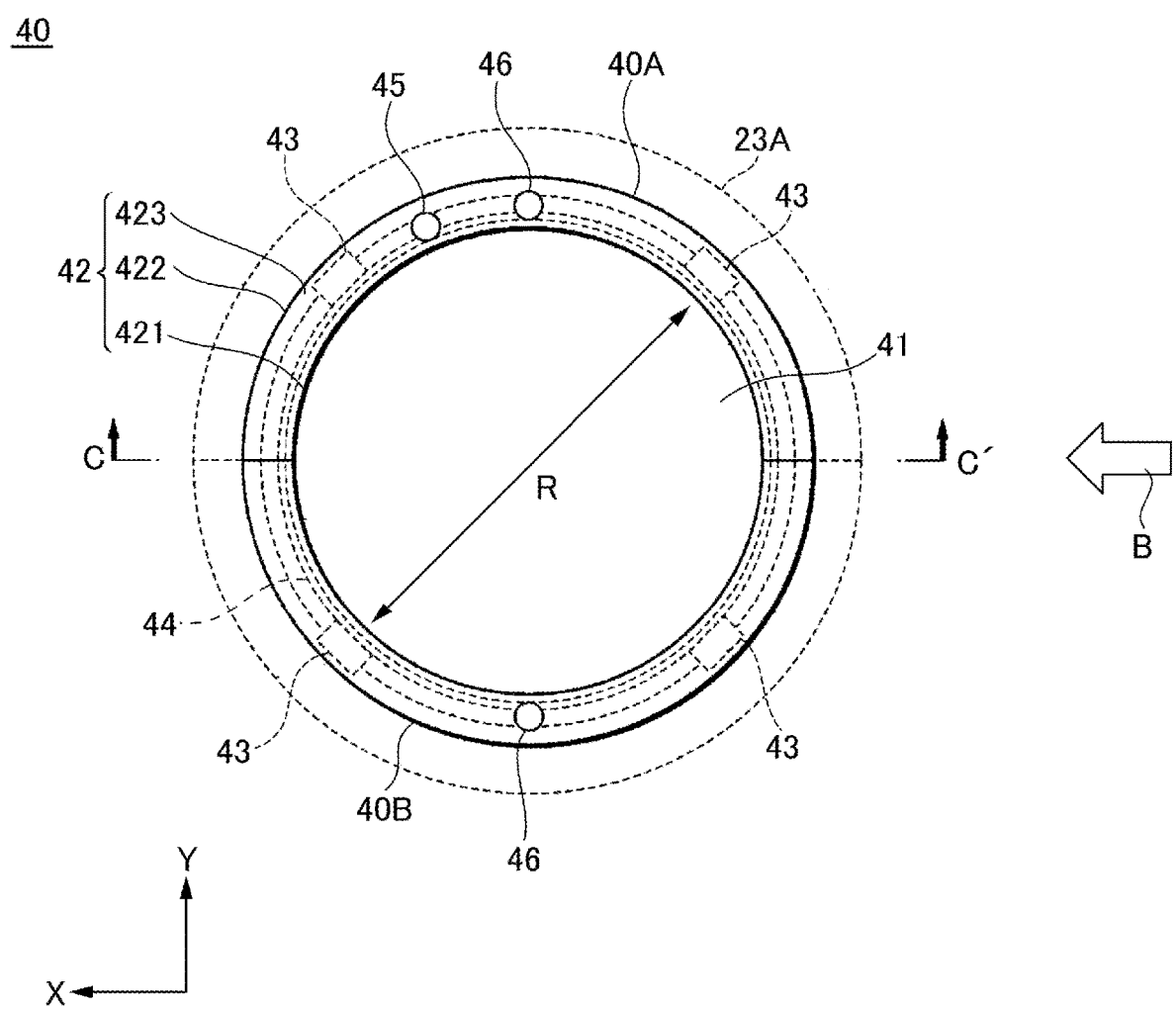
FIG. 4 is a diagram for explaining a detector.
Figure 5:
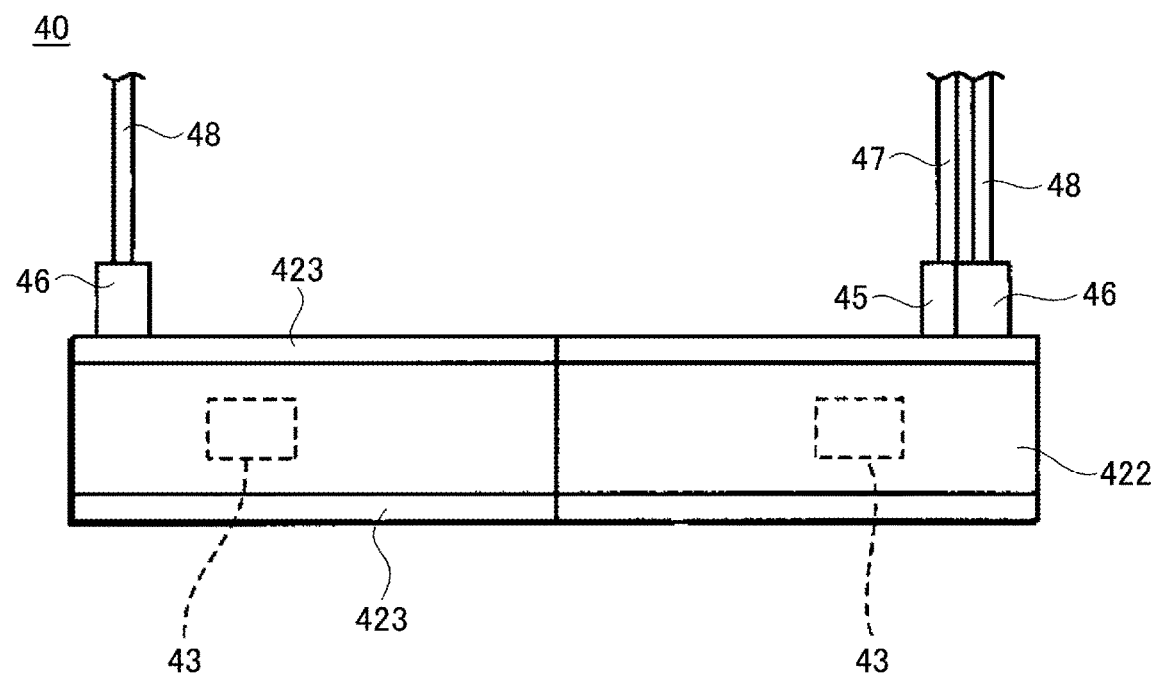
FIG. 5 is a side view of the detector.
Figure 6:
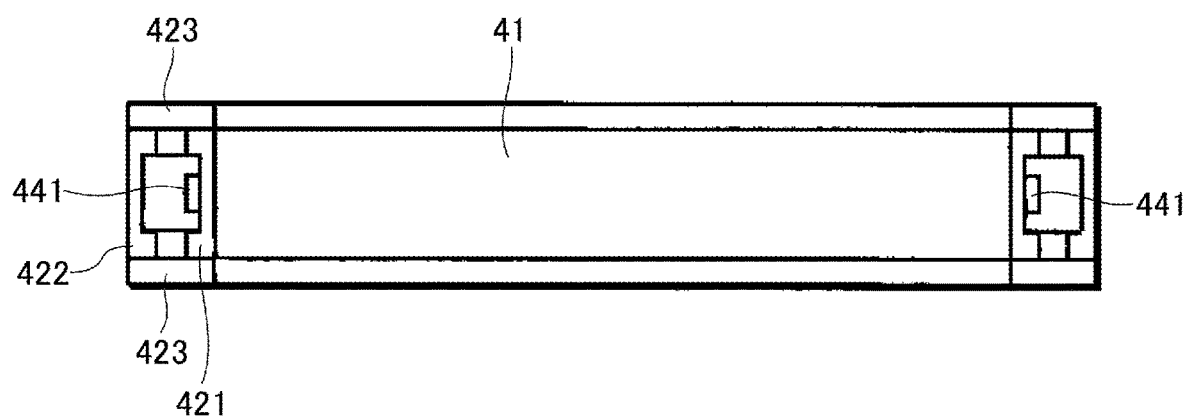
FIG. 6 is a cross sectional view along a line D-D' in FIG. 4.

FIG. 2 is a perspective view of the tension measuring reel. FIG. 3 is a longitudinal view of the tension measuring reel, and corresponds to a cross sectional view along an XZ-plane in FIG. 2. FIG. 4 through FIG. 6 are diagrams for explaining a detector which may be disposed inside a first through hole of the tension measuring reel, and will be described later.

As illustrated in FIG. 2 and FIG. 3, a tension measuring reel 20 may include a solenoid coil forming part 21. As illustrated in FIG. 3, the solenoid coil forming part 21 may have a cylindrical shape, and a first through hole 23A provided inside the solenoid coil forming part 21 along a center axis CL thereof. The first through hole 23A of the solenoid coil forming part 21 may accommodate the cable to be measured. As will be described later, a conductor may be wound around an outer surface of the solenoid coil forming part 21, surrounding the first through hole 23A, thereby forming a first coil which forms a solenoid type magnetizer.

The tension measuring reel 20 according to this embodiment may include an arbitrary member other than the solenoid coil forming part 21.

As illustrated in FIG. 2 and FIG. 3, the tension measuring reel 20 may further include a pulley 22 having a cylindrical shape, and a second through hole 23B, provided at a first end 211 along the longitudinal direction of the first through hole 23A of the solenoid coil forming part 21, that is, at one end along a Z-axis in FIG. 3. In this case, the first through hole 23A and the second through hole 23B preferably form a continuous through hole 23, so that the cable to be measured can be disposed and accommodated inside the through hole 23.

The pulley 22 is a member used to rotate the tension measuring reel 20 when winding a conductor (or a wire) around the solenoid coil forming part 21. For this reason, the solenoid coil forming part 21 and the pulley 22 are preferably provided coaxially and have a common center axis, so that the solenoid coil forming part 21 can rotate according to the rotation of the pulley 22.

The tension measuring reel 20 may include an end fixing portion 24 for fixing an end of the conductor wound around the solenoid coil forming part 21. The end fixing portion 24 is disposed on a second end portion 212 of the solenoid coil forming part 21, located on an opposite side from the first end portion 211. The end fixing portion 24 may have a cylindrical shape, a third through hole 23C, for example. The first through hole 23A, the second through hole 23B, and the third through hole 23C preferably form the continuous through hole 23.

Further, the tension measuring reel 20 may include flanges defining each region on both ends of the pulley 22, the solenoid coil forming part 21, and the end fixing portion 24. More particularly, a first flange 25A and a second flange 25B are provided on both ends of the pulley 22, for example, as illustrated in FIG. 2 and FIG. 3. A second flange 25B and a third flange 25C are provided on both ends of the solenoid coil forming part 21, and a third flange 25C and a fourth flange 25D are provided on both ends of the end fixing portion 24.

As illustrated in FIG. 2 and FIG. 3, the second flange 25B may be used in common by the pulley 22 and the solenoid coil forming part 21, and the third flange 25C may be used in common by the solenoid coil forming part 21 and the end fixing portion 24, respectively. Because the flange is an arbitrary member, it is not necessary to provide all of the flanges described above, and some or all of the flanges may be omitted.

As illustrated in FIG. 2 and FIG. 3, the flange may be provided with openings or the like which guide the conductor for forming the solenoid coil, into and out of the solenoid coil forming part 21, as appropriate.

For example, as illustrated in FIG. 2 and FIG. 3, an inlet 26 may be provided in the third flange 25C in order to guide the conductor from the end fixing portion 24 into the solenoid coil forming part 21. A plurality of inlets 26 may be provided, so as to enable the conductor to be guided into the solenoid coil forming part 21 from arbitrary positions. FIG. 2 illustrates an example in which four inlets 26 are provided at an inner periphery of the third flange 25C and along a circumferential direction of the solenoid coil forming part 21. However, the number and location of the inlets 26 is not particularly limited, and for example, the number of inlets 26 may be more than four, or less than four.

In addition, as illustrated in FIG. 2 and FIG. 3, an outlet 27 may be provided in the third flange 25C. A plurality of outlets 27 may be provided, so as to enable the conductor to be guided out of the solenoid coil forming part 21 from arbitrary positions. FIG. 2 illustrates an example in which four outlets 27 are provided at an outer periphery of the third flange 25C and along the circumferential direction of the solenoid coil forming part 21. However, the number and location of the outlets 27 is not particularly limited, and for example, the number of outlets 27 may be more than four, or less than four.

The measurement of the tension of the cable is required during and after construction of buildings, and when inspecting the buildings at arbitrary timings. Accordingly, the device required for the tension measurement is required to be easily attachable and detachable, naturally without causing damage or the like to the buildings when performing the tension measurement.

Hence, the tension measuring reel 20 is preferably configured to be mountable on an existing cable 30, that is, so that the existing cable 30 can be disposed inside the through hole 23. For this reason, as illustrated in FIG. 2, the tension measuring reel 20 is preferably configured to be divisible into a plurality of members along the circumferential direction of the first through hole 23A. In other words, because the first through hole 23A is included in the through hole 23, the tension measuring reel 20 is preferably configured to be divisible into the plurality of members along the circumferential direction of the through hole 23.

The tension measuring reel 20 illustrated in FIG. 2 is configured to be divisible into two members, namely, a first reel half 20A and a second reel half 20B. However, the number of members to which the tension measuring reel 20 is configured to be divisible is not particularly limited, and the tension measuring reel 20 may be configured to be divisible into three or more members.

The members forming the tension measuring reel 20 are preferably configured so that, after the cable 30 is disposed inside the through hole 23, the members, namely, the first reel half 20A and the second reel half 20B in this example, are combined and fixed into a single tension measuring reel 20.

In FIG. 2, threaded holes 292 are provided in the first flange 25A and the fourth flange 25D. A first connecting plate 28A and a second connecting plate 28B are fixed to the first flange 25A by screws 291 inserted into the threaded holes 292 of the first flange 25A. A third connecting plate 28C and a fourth connecting plate 28D are fixed to the fourth flange 25D by the screws 291 inserted into the threaded holes 292 of the fourth flange 25D. In FIG. 2, the first reel half 20A and the second reel half 20B are fixed together, by fixing the first and second connecting plates 28A and 28B to the first flange 25A, and fixing the third and fourth connecting plates 28C and 28D to the fourth flange 25D, as described above. In the example illustrated in FIG. 2, the first through fourth connecting plates 28A through 28D are preferably curved in accordance with the shapes of the flange surfaces of the first and fourth flanges 25A and 25D, respectively.

However, in the case where the tension measuring reel 20 is divisible into the plurality of members, the method of fixing the members together is not particularly limited. For example, the second and third connecting plates 28B and 28C may be hinged, and the first reel half 20A and the second reel half 20B may be configured to be opened or closed only on the side to be fixed by the first and fourth connecting plates 28A and 28D.

The material (or quality of material) of the tension measuring reel 20 needs to be non-magnetic, so as not to affect the magnetic field generated by the first coil. For example, non-magnetic metals, such as aluminum or the like, and various kinds of resins, are preferably used for the material forming the tension measuring reel 20. Because heat is generated from the first coil famed on the solenoid coil forming part 21, aluminum, having excellent heat dissipation properties, is preferably used for the material forming the tension measuring reel 20, but the material forming the tension measuring reel 20 is of course not limited to aluminum.

As illustrated in FIG. 3, the tension measuring reel 20 may further include a detector 40 inside the first through hole 23A. The detector 40 may include a magnetic field sensor for measuring the magnetic field intensity generated near the cable 30 disposed inside the first through hole 23A, and a magnetic flux sensor for measuring the magnetic flux or the magnetic flux density through the cable 30.

The detector 40 may be disposed in the first through hole 23A, but is preferably disposed at a center portion along a longitudinal direction of the first through hole 23A, that is, the Z-axis direction in FIG. 3, as illustrated in FIG. 3. The center portion does not need to be located perfectly at the center, and may be located near the center along the longitudinal direction of the first through hole 23A.

The detector 40 can measure the magnetic field intensity generated by the first coil famed on the solenoid coil forming part 21, and the magnetic flux and the magnetic flux density generated inside the cable 30 disposed inside the first through hole 23A due to the generated magnetic field. Hence, the detector 40 is preferably disposed to surround an outer surface of the cable 30 disposed inside the first through hole 23A. For this reason, the detector 40 preferably has an annular shape.

The configuration of the detector 40 is not particularly limited, and the detector 40 may be configured as follows, for example.

An example of the configuration of the detector 40 will be described, with reference to FIG. 4 through FIG. 6.

FIG. 4 through FIG. 6 illustrate the detector 40 on an enlarged scale. FIG. 4 is a bottom view of the detector 40, which corresponds to a view along the Z-axis in FIG. 2 and FIG. 3, for example. In FIG. 4, the first through hole 23A of the tension measuring reel 20 is indicated by a dotted line. FIG. 5 is a side view of the detector 40, and corresponds to a view along a thick arrow B in FIG. 4. FIG. 6 is a cross sectional view along a line C-C' line in FIG. 4.

The detector 40 may have the annular shape as a whole, as described above. Hence, when viewed from a bottom or top surface of the detector 40, the detector 40 includes a through hole 41. In the following description, when the through hole 41 of the detector 40 is to be distinguished from the first through hole 23A or the like of the tension measuring reel 20, the through hole 41 may be referred to as a fourth through hole.

A diameter R of the through hole 41, which corresponds to an inside diameter of the detector 40, is preferably greater than an outside diameter of the cable to be measured.

The detector 40 may include a housing 42 having an annular shape, for holding the magnetic field sensors or the like which will be described later. A configuration of the housing 42 is not particularly limited, and may include an inner plate 421 having a cylindrical shape, an outer plate 422 having a cylindrical shape, and side plates 423 connecting the inner plate 421 and the outer plate 422.

As illustrated in FIG. 4 through FIG. 6, the inner plate 421 has the cylindrical shape with the through hole 41 described above at the center portion thereof, and the outer plate 422 has the cylindrical shape with an opening having a diameter greater than the inner plate 421. The size of the outer plate 422 may be selected, so that the magnetic field sensor or the like can be accommodated in a space between the inner plate 421 and the outer plate 422, and so that the detector 40 can be accommodated inside the first through hole 23A of the tension measuring reel 20. The side plates 423 may be provided on top and bottom surfaces of the space between the inner plate 421 and the outer plate 422, so as to cover the space between inner plates 421 and outer plates 422. The side plates 423 may have a disc shape with an opening corresponding to the through hole 41 at the center portion thereof.

The material of the housing 42 needs to be non-magnetic, in order not to affect the measured values of the magnetic field intensity, the magnetic flux, or the like, and also needs to be a non-conductive (or insulating) to avoid generation of the eddy current. For this reason, various kinds of resins, for example, are preferably used for the material forming the housing 42. Although the detector 40 of this example includes the housing 42, the configuration of the detector 40 is not particularly limited. For example, the magnetic field sensor or the like which will be described later may be provided and fixed directly on the inner surface of the first through hole 23A. In this case, the housing of the detector 40 may be omitted.

The detector 40 may include a plurality of magnetic field sensors 43 disposed to surround the through holes 41. The magnetic field sensor 43 can measure the magnetic field intensity near the surface of the cable 30 disposed inside the through hole 41, and may use a Hall element, for example.

Because the detector 40 includes the magnetic field sensor 43, and generates the magnetic field by supplying a current to the first coil famed on the solenoid coil forming part 21, an amount of power supplied to the first coil is adjusted according to the detected magnetic field intensity, thereby generating the magnetic field having a desired intensity.

A plurality of magnetic field sensors 43 are preferably provided along the circumferential direction of the through hole 41. When providing the plurality of magnetic field sensors 43, the magnetic field sensors 43 are preferably separated by the same distance. By providing the plurality of magnetic field sensors 43, and outputting an average value of outputs of the magnetic field sensors 43 as the detection value, it is possible to reduce a measurement error in a case where the measuring target is the cable having the stranded wire structure or a plurality of cables, even if the distance between the magnetic field sensor 43 and the wire or the cable is not constant for each of the magnetic field sensors 43 and each of the corresponding wires or cables, respectively.

The detector 40 may include a magnetic flux sensor 44 which is disposed to surround the through hole 41. The configuration of the magnetic flux sensor 44 is not particularly limited, and the magnetic flux sensor 44 may use a coil, for example. The magnetic flux sensor 44 can measure the magnetic flux and the magnetic flux density generated inside the cable 30 to be measured, using the magnetic field generated by the first coil formed on the solenoid coil forming part 21 of the tension measuring reel 20. The tension of the cable 30 may be computed based on the magnetic flux or the magnetic flux density measured by the magnetic flux sensor 44.

The side plate 423 may be provided with a connector, and the magnetic field sensor 43 or the magnetic flux sensor 44 may be connected to an external device via the connector. For example, a first connector 45 may be provided to connect the magnetic field sensor 43 to a first shield wire 47 via the first connector 45. A second connector 46 may also be provided to connect the magnetic flux sensor 44 to a second shield wire 48 via the second connector 46.

The detector 40 is also preferably configured to be attachable to the existing cable. For this reason, as illustrated in FIG. 4, the detector 40 is preferably configured to be divisible into a plurality of members along the circumferential direction of the through hole 41. FIG. 4 illustrates an example in which the detector 40 is configured to be divisible into two members, namely, a first half 40A and a second half 40B. However, the number of members to which the detector 40 is configured to be divisible is not particularly limited, and the detector 40 may be configured to be divisible into three or more members.

Because the detector 40 includes the magnetic flux sensor 44, which is the coil as described above, the wiring of the coil of the magnetic flux sensor 44 is preferably configured to enable bonding when the first half 40A and the second half 40B of the detector 40 are combined. For this reason, when the first half 40A and the second half 40B are divided along a division line, as illustrated in FIG. 6, for example, connection terminals 441 are preferably provided at both ends of the conductor forming the magnetic flux sensor 44 on the side of the first half 40A. In addition, connection terminals, corresponding to the connection terminals 441, are preferably provided at both ends of the conductor forming the magnetic flux sensor 44 on the side of the second half 40B, so that the connection terminals and the connection terminals 441 connect with each other to form the coil of the magnetic flux sensor 44 when the first half 40A and the second half 40B are combined.

Although only the magnetic flux sensor 44 is described above, connection terminals may also be provided on the conductor connecting the magnetic field sensor 43, as appropriate. In this case, the connection terminals may be configured to connect to each other when the first half 40A and the second half 40B are combined.

In addition, when the tension measuring reel 20 and the detector 40 are divisible into the plurality of members, and the plurality of members are combined, the division lines preferably pass through the through hole 23 and are positioned on the same plane parallel to the through hole 23.

The detector 40 described above may be fixed inside the first through hole 23A of the tension measuring reel 20, and may be configured to be detachable.

[Tension Measuring Device]

Figure 7:
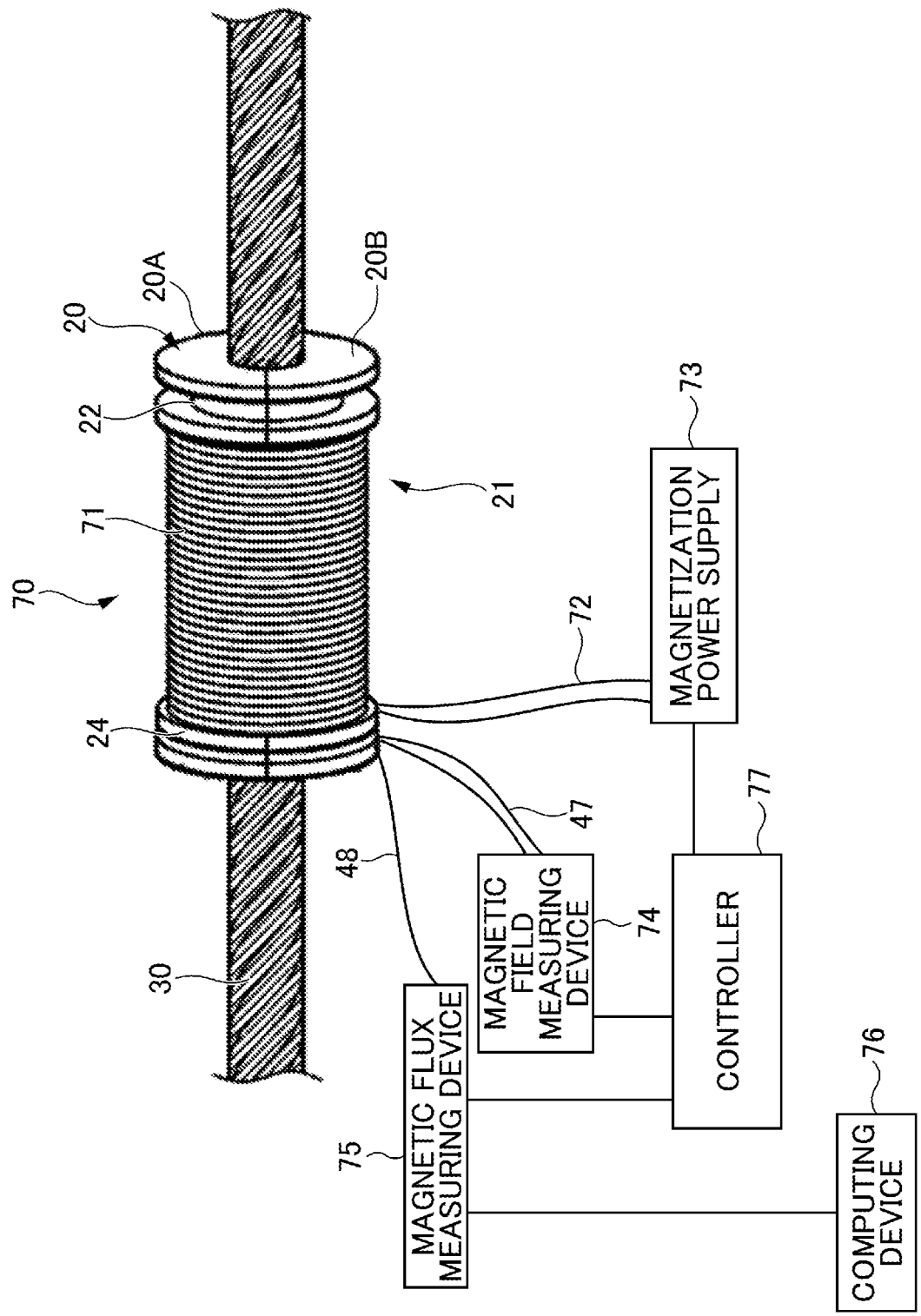
FIG. 7 is a perspective view of a tension measuring device.

Next, the tension measuring device according to this embodiment will be described, with reference to FIG. 7.

A tension measuring device 70 according to this embodiment may include the tension measuring reel 20 described above, and a first coil 71 formed by winding the conductor around the solenoid coil forming part 21 of the tension measuring reel 20.

More particularly, after the tension measuring reel 20 is installed on the cable 30 to be measured, a conductor 72 is wound around the outer surface of the solenoid coil forming part 21 to form the first coil 71. Details of the procedures to form the first coil 71 or the like will be described later in conjunction with the description of the tension measuring method.

Both ends of the conductor 72 of the first coil 71 of the tension measuring device 70 may be connected to a magnetization power supply 73. As will be described later, the magnetization power supply 73 includes a polarity switching device (or switch) which reverses the polarity of the supplied electricity, in order to vary the intensity and orientation of the magnetic field generated around the cable 30 to be measured, and create a hysteresis loop. A bipolar power supply may be used as the magnetization power supply 73.

The first shield wire 47, connected to the magnetic field sensor 43 of the detector 40 provided inside the first through hole 23A of the tension measuring reel 20, may be connected to a magnetic field measuring device 74, and the second shield wire 48, connected to the magnetic flux sensor 44, may be connected to a magnetic flux measuring device 75.

In addition, the magnetic flux measuring device 75 may be connected to a computing device 76. The computing device 76 can compute the tension of the cable, based on the magnetic field intensity measured by the magnetic field measuring device 74, and the magnetic flux or the magnetic flux density measured by the magnetic flux measuring device 75. The computing device 76 may be input in advance with (i) a relational expression (or formula) of the magnetic field intensity and the magnetic flux or the magnetic flux density of the cable, versus the tension, (ii) a calibration curve, or the like, as appropriate.

The magnetic field measuring device 74 may be connected to the computing device 76. Further, the computing device 76 may be connected to a controller 77 which will be described later.

The tension measuring device 70 of this embodiment may further include the controller 77, for example. The controller 77 may be formed by a processor, such as a center processing unit (CPU), and may further include a memory which stores a program to be executed by the CPU, as appropriate.

The controller 77 may be connected to one or more devices selected from the magnetization power source 73, the magnetic field measuring device 74, and the magnetic flux measuring device 75. For example, the controller 77 may be configured to acquire data on the magnetic field intensity measured by the magnetic field measuring device 74, and control an amount of power supplied by the magnetization power source 73.

Further, as will be described later, a hysteresis loop of the cable may be created when measuring the tension of the cable. Hence, the controller 77 may control the amount of power output by the magnetization power source 73, based on the magnetic field intensity measured by the magnetic field measuring device 74, so that the magnetic field intensity generated by the first coil 71 varies, for example, in order to enable the creation of the hysteresis curve.

In the tension measuring device 70 according to this embodiment described above, the cable 30 to be measured can be accommodated inside the first through hole 23A, and the first coil 71, which becomes an electromagnet, can be formed on the solenoid coil forming part 21 surrounding the first through hole 23A. For this reason, by using the tension measuring device 70 according to this embodiment, a uniform and stable magnetic field can be generated by the first coil 71, around the cable 30 to be measured. Moreover, by adjusting the amount of power supplied to the first coil 71, the magnetic field intensity can be controlled, and the cable 30 can generate the magnetic field which reaches the predetermined magnetization region.

Accordingly, by generating the magnetic field which reaches the predetermined region or point, such as the near-saturation magnetization region or the like on the hysteresis loop, and measuring the magnetic flux or the magnetic flux density generated inside the cable, it is possible to compute the tension of the cable in a highly reproducible manner.

[Tension Measuring Method]

Next, the tension measuring method according to this embodiment will be described.

Because the tension measuring method according to this embodiment can be performed using the tension measuring apparatus described above, the description of the same parts, operations, or the like may be omitted in the following.

The tension measuring method according to this embodiment may include the following processes or steps.

A first reel installing process installs a tension measuring reel having a cylindrical solenoid coil forming part on a cable to be measured.

A first coil forming process forms a first coil by winding a conductor around the solenoid coil forming part to form a first coil.

A magnetization characteristics measuring process measures a magnetic hysteresis loop of the cable by supplying a current to the first coil to generate a magnetic field.

A tension computing process computes a tension of the cable using a parameter determined from the magnetic hysteresis loop.

In the magnetization characteristics measuring process, the magnetic field is varied so that the hysteresis loop includes a near-saturation magnetization region, and the hysteresis loop is measured using a magnetic field sensor and a magnetic flux sensor.

The parameter used in the tension computing process may be one or more parameters selected from a magnetic flux or a magnetic flux density, a remanent magnetization, a coercivity, a magnetic permeability, and a hysteresis loss in the near-saturation magnetization region.

Figure 8:
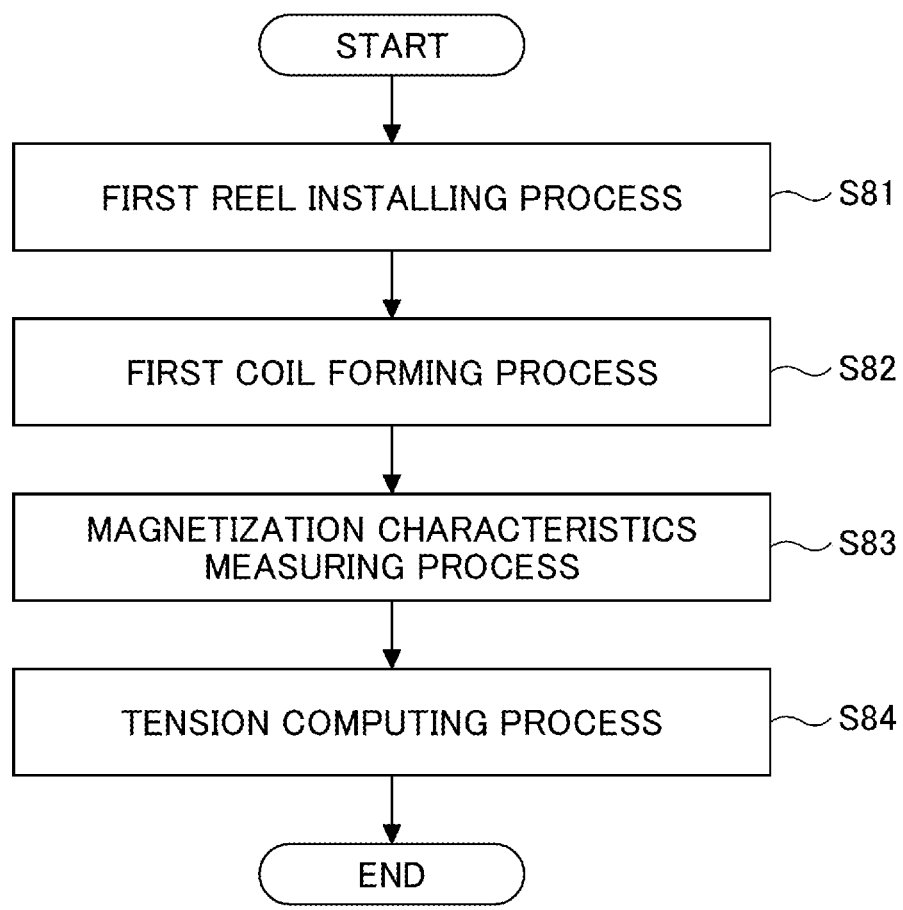
FIG. 8 is a flow chart for explaining a tension measuring method according to one aspect of the present disclosure.

The tension measuring method according to this embodiment may be performed according to a flow chart 80 illustrated in FIG. 8. Hereinafter, each process or step will be described. In the flow chart 80 illustrated in FIG. 8, reference numerals S81 through S84 are added after process names.

[First Reel Installing Process S81]

A first reel installing process S81 may install a tension measuring reel having a cylindrical solenoid coil forming part on a cable to be measured.

As described above, the solenoid coil forming part includes the first through hole provided inside the solenoid coil forming part along the center axis thereof, and the magnetic field sensor and the magnetic flux sensor are provided inside the first through hole. In the first reel installing process S81, the tension measuring reel may be installed on the cable so that the cable is positioned inside the first through hole.

The cable to be measured by the tension measuring method according to this embodiment is not particularly limited, and the tension measuring method may be used to measure the tension of various kinds of cables applied with tension. However, the tension measuring method according to this embodiment generates the magnetic field around the cable, and the cable is magnetized by the magnetic field. For this reason, in the cable to be measured, at least a part of the wires forming the cable includes a ferromagnetic material. Examples of the cable to be measured include a main cable and a hanger rope used in suspension bridges, a diagonal used in cable stayed bridges, prestressed concrete (PC) steel used in prestressed concrete, such as PC steel strand including a plurality of stranded wires, PC steel bar, or the like.

In buildings or the like, a plurality of non-stranded cables may be used collectively. However, because the cables are in contact with each other and vibration cannot be applied appropriately, it is difficult to measure the tension of the cables using the conventional vibration method. The vibration method requires a cable length, namely, a distance between the fixed points, to compute the tension. However, in the case where the plurality of cables are provided as described above, the cable length may not be apparent because the cables may intersect, make contact, or the like, and the tension cannot be computed in such cases. However, the tension measuring method according to this embodiment can generate a uniform magnetic field using the solenoid coil, and magnetize the cable by the generated magnetic field, so that the tension can be measured in a reproducible manner with respect to the plurality of cables. For this reason, the cable to be measured by the tension measuring method according to this embodiment may be a single cable or two or more cables. The tension measuring method according to this embodiment can measure the tension of the cable to be measured in a reproducible manner, even if two or more cables are provided and the plurality of cables are to be measured, and this embodiment can provide a highly effective tension measuring method compared to the prior art.

The description of the tension measuring reel will be omitted, because the tension measuring reel is already described above.

As described above, the detector 40, including the magnetic field sensor 43 and the magnetic flux sensor 44, is disposed inside the first through hole 23A of the tension measuring reel 20. For this reason, the cable 30 can be installed inside the through hole 41 of the detector 40, by installing the cable 30 inside the first through hole 23A of the tension measuring reel 20.

The tension measuring reel 20 is preferably divisible into the plurality of members along the circumferential direction of the first through hole 23A, as described above. More particularly, as described with reference to FIG. 2 or the like, the tension measuring reel 20 may be configured to be divisible into the first reel half 20A and the second reel half 20B, for example. In the case where the tension measuring reel 20 is divisible into the plurality of members, the first reel installing process S81 can install the tension measuring reel 20 by disposing the plurality of members forming the tension measuring reel 20 along the circumferential direction of the cable 30 and assembling the plurality of members. In the case of the tension measuring reel 20 illustrated in FIG. 2, for example, the first reel half 20A and the second reel half 20B are first disposed along the circumferential direction of the cable 30. Then, the first reel half 20A and the second reel half 20B are fixed at the first flange 25A and the fourth flange 25D of the tension measuring reel 20, by fixing the first connecting plate 28A, the second connecting plate 28B, the third connecting plate 28C, and the fourth connecting plate 28D by the screws 291.

Accordingly, by configuring the tension measuring reel 20 to be divisible into the plurality of members, it becomes possible to install the tension measuring reel 20 on the existing cable, and measure the tension of the existing cable. That is, if the tension measuring reel 20 is divisible into the plurality of members, the cable to be measured may be a cable to be newly installed, or the existing cable that is already installed.

By performing the first reel installing process S81, the tension measuring reel 20 is installed around the cable 30, as illustrated in FIG. 2.

[First Coil Forming Process S82]

A first coil forming process S82 may wind a conductor around the solenoid coil forming part of the tension measuring reel, to form a first coil which forms a solenoid magnetizer.

The first coil forming process S82 may wind the conductor 72 around the solenoid coil forming part 21 as follows, to form the first coil.

When performing the first coil forming process S82, the end of the conductor 72 to be wound around the solenoid coil forming part 21 is inserted through the arbitrary inlet 26 formed in the third flange 25C of the tension measuring reel 20, and wound around and fixed to the end fixing portion 24.

Then, the conductor 72 is wound around the solenoid coil forming part 21 by rotating the tension measuring reel 20 around a center formed by the cable 30. In this case, the conductor 72 is wound around the solenoid coil forming part 21 by regular or normal winding, that is, uniformly wound around the solenoid foil forming part 21, so that the first coil can uniformly magnetize the cable 30. Preferably, the operator adjusts the position at which the leads are wound so that the leads can be wound in alignment. An operator preferably adjusts the position where the conductor 72 is wound, so that the conductor 72 can be wound by the regular or normal winding. After the winding of the conductor 72 around the solenoid coil forming part 21 ends and the first coil is formed, the other end of the conductor 72 is preferably fixed through the arbitrary outlet 27 formed in the third flange 25C, or fixed to the first coil of the solenoid coil forming part 21.

The method of rotating the tension measuring reel 20 is not particularly limited. For example, a rope, wound around a rotatable drum, may be drawn out and wound around the pulley 22 of the tension measuring reel 20, to connect an end of the rope to a winch. Then, the tension measuring reel 20, including the pulley 22, can be rotated by winding the rope with the winch.

By the operation described above, it is possible to form the first coil by winding the conductor around the solenoid coil forming part of the tension measuring reel. Further, it is possible to form the tension measuring device 70 illustrated in FIG. 7.

By using the first coil to generate the magnetic field for magnetizing the cable 30, the magnetic field inside a region surrounded by the first coil, such as inside the first through hole 23A, for example, can be made particularly uniform compared to the case where the permanent magnet generates the magnetic field for magnetizing the cable 30. For this reason, even if the cable to be measured is thick or includes a plurality of cables, it is possible to uniformly magnetize the cable or cables, and appropriately evaluate the tension of the cable or cables. In addition, because the magnetic field intensity can be varied, it is possible to create the hysteresis loop, and measure the remanent magnetization and the coercivity.

After the first coil forming process S82 ends, both ends of the conductor 72 of the first coil 71 of the tension measuring device 70 may be connected to the magnetization power supply 73. The first shield wire 47, connected to the magnetic field sensor 43 of the detector 40 installed inside the first through hole 23A of the tension measuring reel 20, may be connected to the magnetic field measuring device 74. The second shield wire 48, connected to the magnetic flux sensor 44, may be connected to the magnetic flux measuring device 75.

[First Magnetization Characteristics Measuring Process S83]

A first magnetization characteristics measuring process S83 may generate a magnetic field by supplying a current to the first coil, and measure a hysteresis loop of the cable. When measuring the hysteresis loop, the magnetic field is varied so that the hysteresis loop includes a near-saturation magnetization region. More particularly, the magnetic field is increased and decreased repeatedly, so that the hysteresis loop includes the near-saturation magnetization region.

The hysteresis loop is measured from the magnetic field intensity measured by the magnetic field sensor installed inside the first through hole, and the magnetic flux or the magnetic flux density inside the cable is measured by the magnetic flux sensor installed inside the first through hole.

Each of the magnetic flux or the magnetic flux density, the remanent magnetization, the coercivity, the magnetic permeability, the hysteresis loss, or the like can be measured by creating the hysteresis loop. As described above, the magnetic permeability is the slope at a point on the hysteresis loop. The hysteresis loss is a value proportional to the area of the region surrounded by the hysteresis loop.

The near-saturation magnetization region refers to a region in which a magnetization curve follows the same curve while the magnetic field increases or decreases and varies, that is, a region where the hysteresis loop is closed.

When measuring the hysteresis loop, the magnetic field is preferably varied gradually, in order to reduce the generation of the eddy current caused by the variations of the magnetic field. More particularly, in the magnetization characteristics measuring process S83, the hysteresis loop is preferably measured over a time of 60 seconds or longer per cycle, and more preferably over a time of 80 seconds or longer per cycle.

When the hysteresis loop is measured over the time of 60 seconds or longer per cycle, a gradual variation of the magnetic field can be provided such that no eddy current is generated in the cable to be measured. For this reason, it is possible to measure the magnetization characteristics of the cable with a particularly high accuracy.

As described above, because the magnetic field variation is preferably gradual, an upper limit of the time over which the hysteresis loop is measured per cycle is not particularly limited. However, from a viewpoint of productivity, the time required to measure the hysteresis loop per cycle is preferably 300 seconds or shorter, and more preferably 180 seconds or shorter.

One cycle of hysteresis loop measurement refers to one creation of the hysteresis loop illustrated in FIG. 1. In other words, one cycle of the hysteresis loop measurement refers to one process of increasing or decreasing the magnetic field in one direction, followed by increasing or decreasing the magnetic field in a direction opposite to the one direction.

In the first magnetization characteristics measuring process S83, the hysteresis loop is preferably measured two or more times, that is, the hysteresis loop measurement is performed for two or more cycles.

By repeating the hysteresis loop measurement two or more times, it is possible to measure particularly accurate values of the magnetization characteristics, such as the remanent magnetization and the coercivity that are unaffected by the magnetic history immediately before the start of the hysteresis loop measurement. Further, as described above, it is possible to determine whether or not the hysteresis loop is created in a reproducible manner, by performing the hysteresis loop measurement two or more times. In the first magnetization characteristics measuring process S83, the hysteresis loop is preferably measured a number of times in a range of two times or more and five times or less, for example. Among the measured hysteresis loops, the hysteresis loops having the same shape are preferably used for the computation of the tension of the cable.

The magnetic field sensor 43 can measure the magnetic field intensity near the cable 30, and measure the magnetic field intensity generated by the first coil 71. As described above, the Hall element may be used for the magnetic field sensor 43, for example.

The magnetic flux sensor 44 can measure the magnetic flux passing through the cable 30 which is magnetized by the first coil 71. During the measurement of the magnetic flux, the tension measuring device 70 is fixed and is not moved. For this reason, a cross sectional area of the cable at a point of measurement is fixed, thereby making it possible for the magnetic flux sensor 44 to also measure the magnetic flux density.

The first magnetization characteristics measuring process S83 may simply be referred to as a magnetization characteristic measuring process, if not distinguishing the first magnetization characteristics measuring process S83 from a second magnetization characteristics measuring process which will be described later.

[Tension Computing Process S84]

A tension computing process S84 may compute the tension of the cable from the hysteresis loop accurately measured by the first magnetization characteristics measuring process S83 described above.

As described above, the tension of the cable may be computed using the magnetic flux or the magnetic flux density, the remanent magnetization, the coercivity, the magnetic permeability, the hysteresis loss, or the like in the near-saturation magnetization region, for example.

Figure 10:
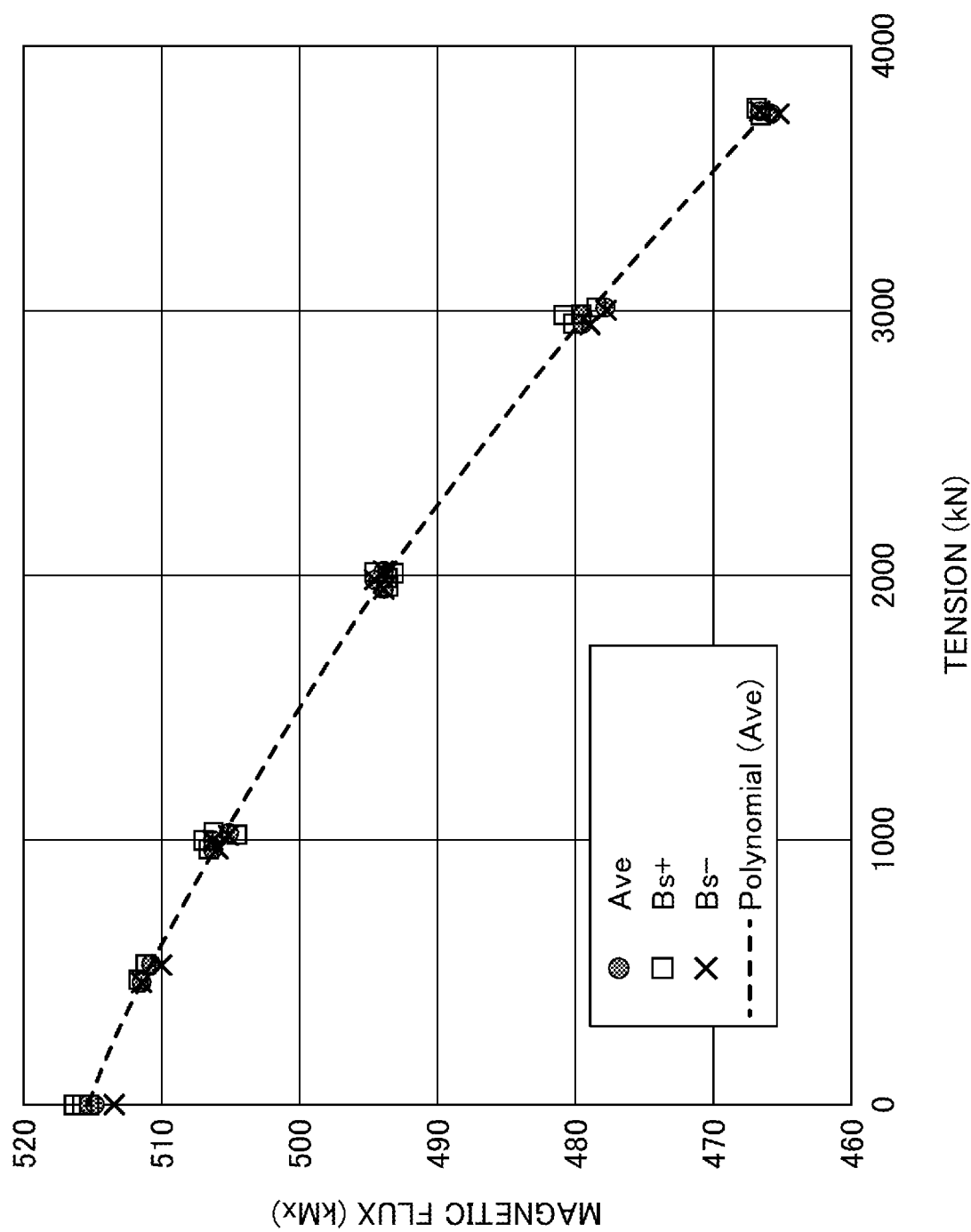
FIG. 10 is a diagram for explaining a relationship between the tension of the cable, and a magnetic flux in a near-saturation magnetization region.
Figure 11:
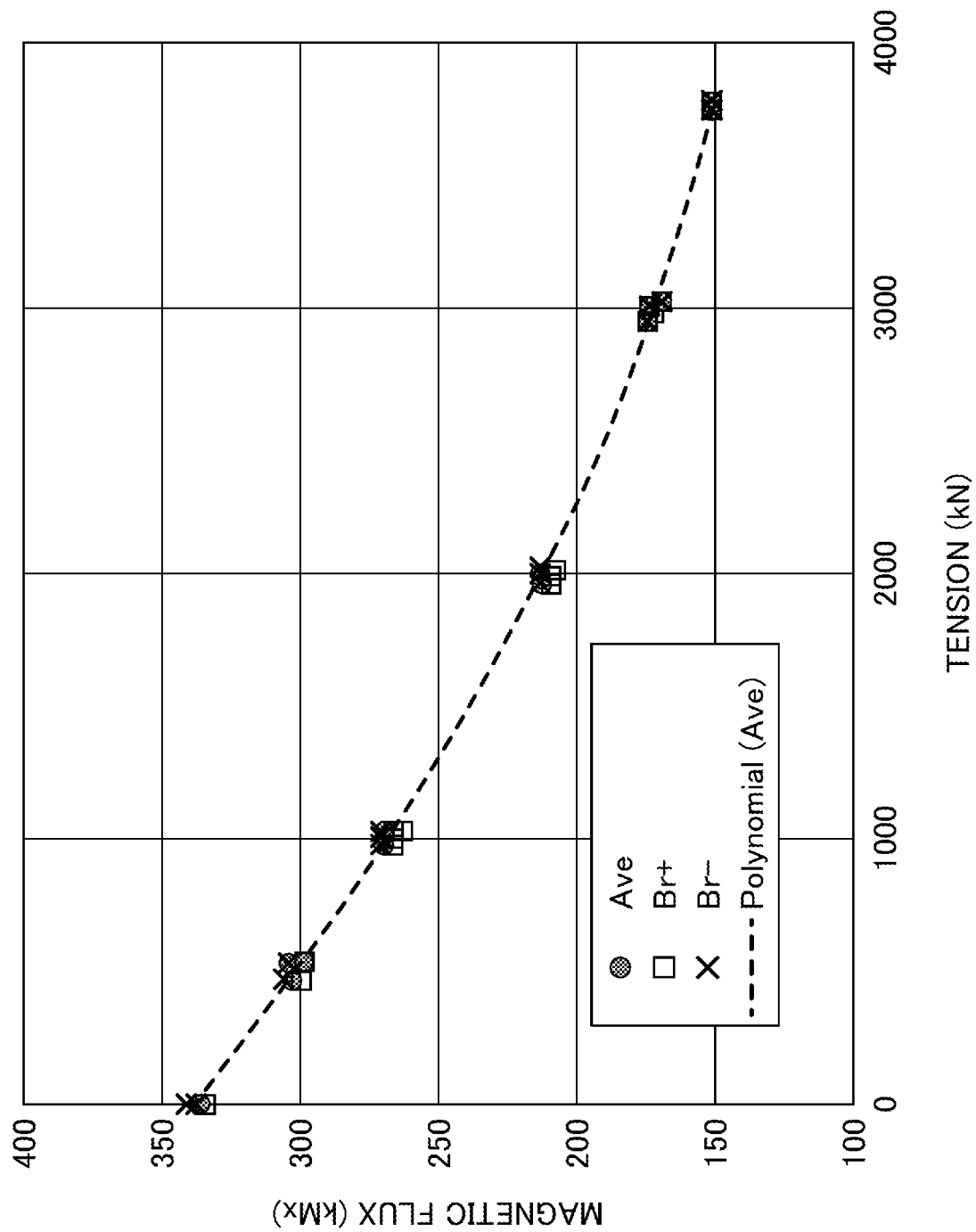
FIG. 11 is a diagram for explaining a relationship between the tension of the cable, and a remanent magnetization.
Figure 12:
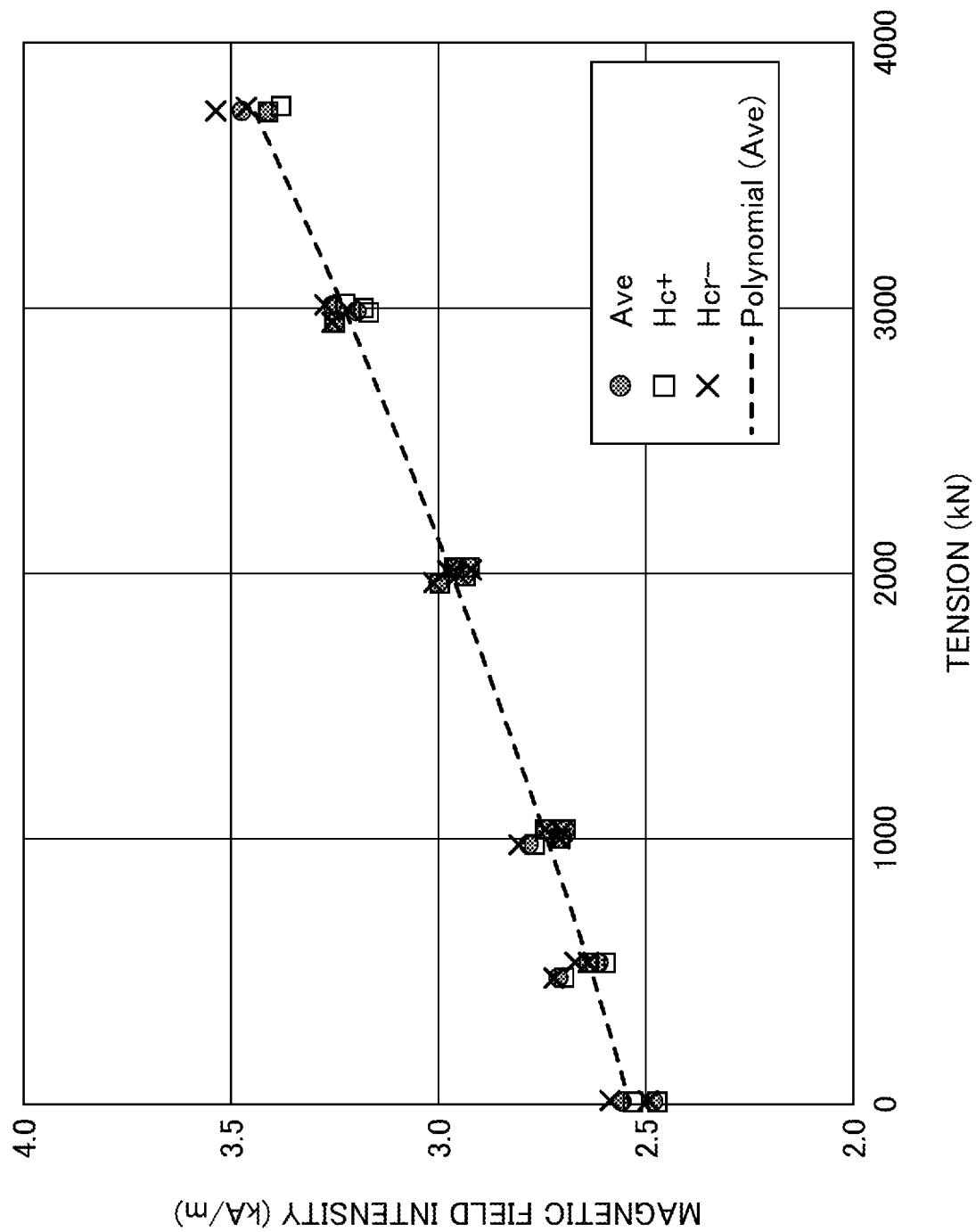
FIG. 12 is a diagram for explaining a relationship between the tension of the cable, and a coercivity.
Figure 13:
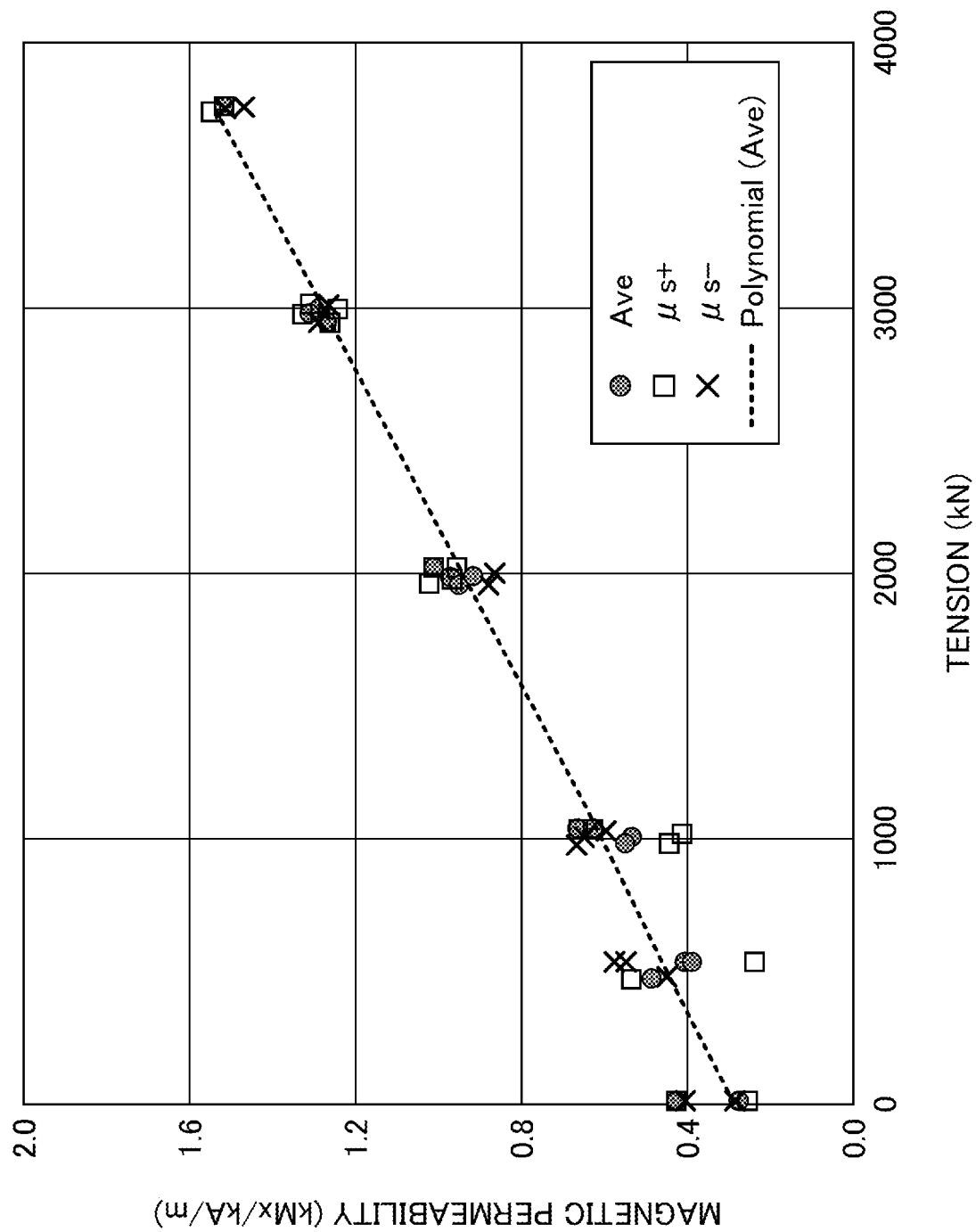
FIG. 13 is a diagram for explaining a relationship between the tension of the cable, and a magnetic permeability in the near-saturation magnetization region.
Figure 14:
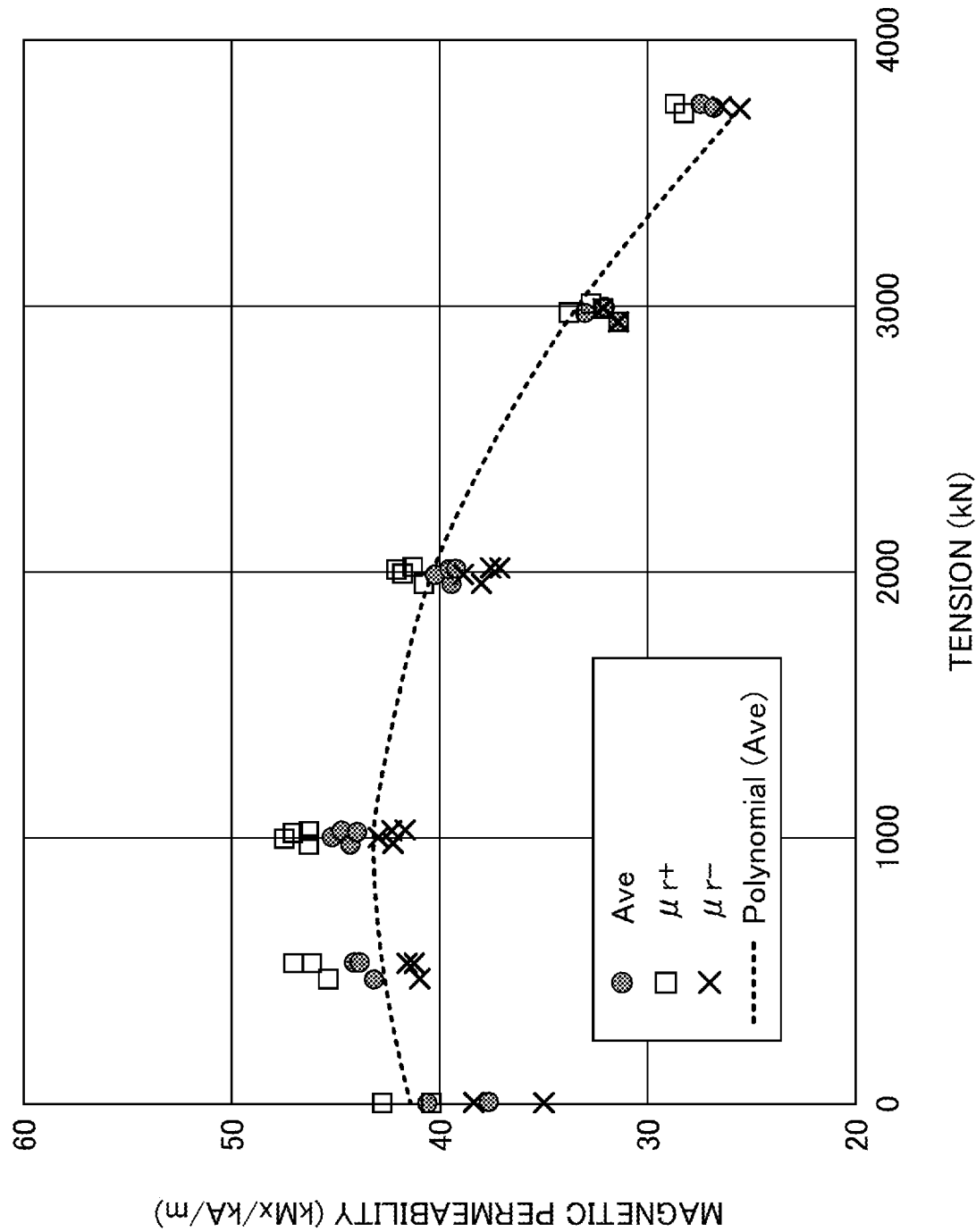
FIG. 14 is a diagram for explaining a relationship between the tension of the cable, and the magnetic permeability at a point of the remanent magnetization.
Figure 15:
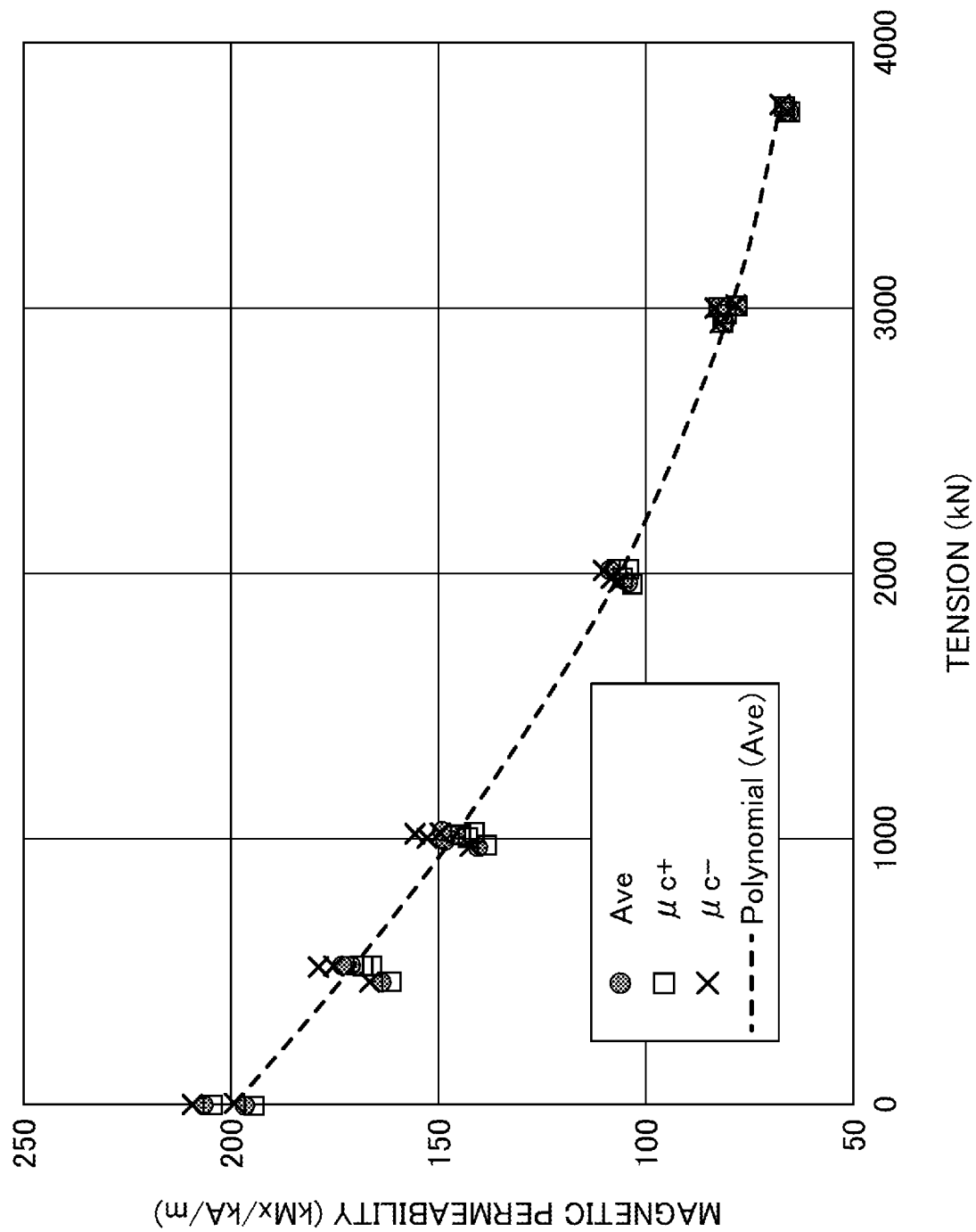
FIG. 15 is a diagram for explaining a relationship between the tension of the cable, and the magnetic permeability at a point of the coercivity.
Figure 16:
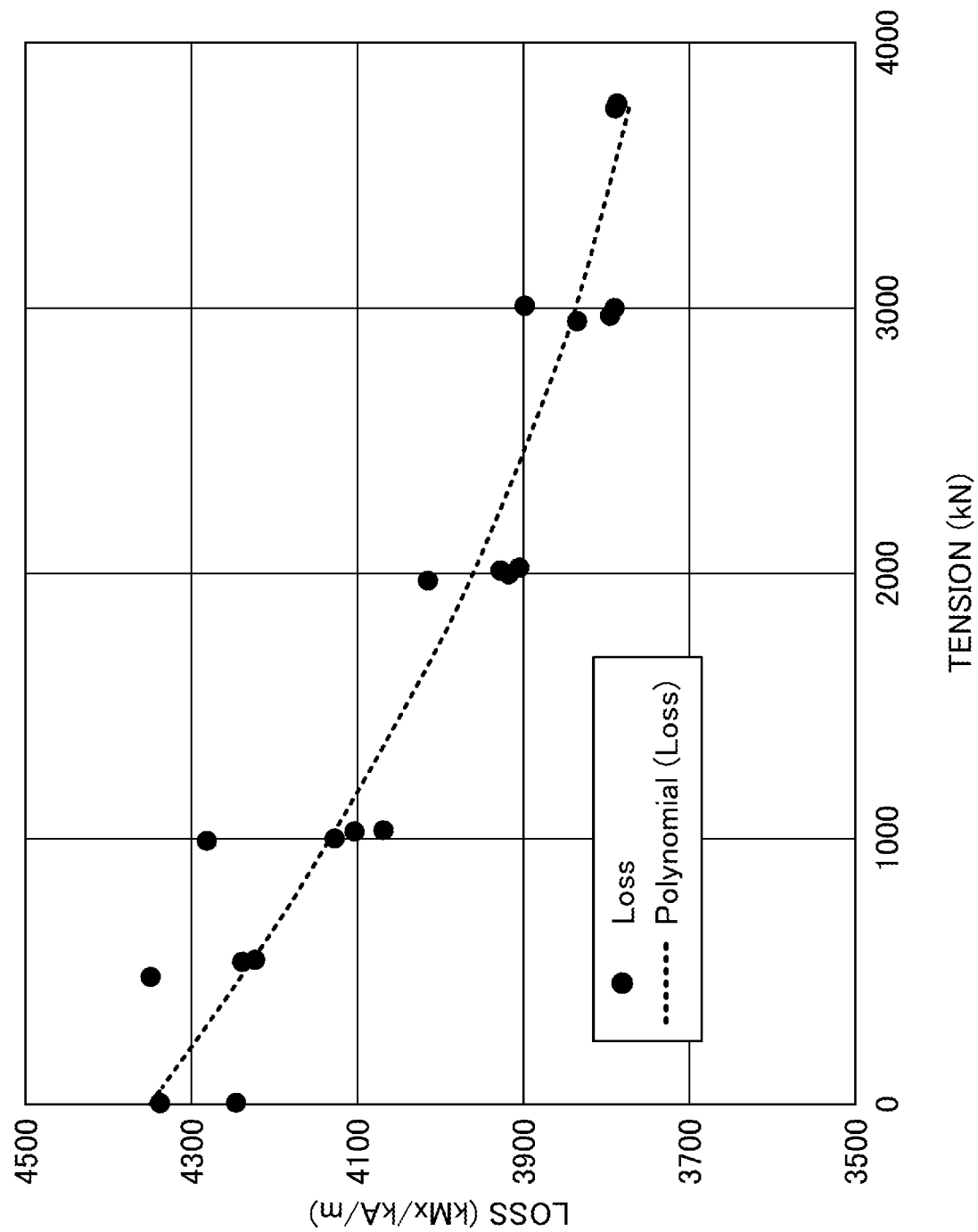
FIG. 16 is a diagram for explaining a relationship between the tension of the cable, and a hysteresis loss.

FIG. 10 through FIG. 16 illustrate relationships between the tension applied to the cable, and each of parameters described in the following. FIG. 10 illustrates the relationship between the tension and the magnetic flux in the near-saturation magnetization region. FIG. 11 illustrates the relationship between the tension and the remanent magnetization. FIG. 12 illustrates the relationship between the tension and the coercivity. FIG. 13 illustrates the relationship between the tension and the magnetic permeability in the near-saturation magnetization region. FIG. 14 illustrates the relationship between the tension and the magnetic permeability at a point of the remnant magnetization. FIG. 15 illustrates the relationship between the tension and the magnetic permeability at a point of the coercivity. FIG. 16 illustrates the relationship between the tension and the hysteresis loss.

As illustrated in FIG. 10 through FIG. 16, the tension of the cable has a correlation to the magnetic flux or the magnetic flux density, the remanent magnetization, the coercivity, the magnetic permeability, the hysteresis loss, or the like in the near-saturation magnetization region, and these parameters may be used to compute the tension of the cable. The hysteresis loss is proportional to the area of the hysteresis loop. For this reason, the use of the hysteresis loss as the parameter used for computing the tension of the cable, includes using the area of hysteresis loop as the parameter used for computing the tension of the cable.

Although it is possible to compute the tension of the cable using only one of the parameters described above, according to studies conducted by the present inventors, it was found that, from a viewpoint of increasing the accuracy of the measurement, the tension of the cable is preferably computed using a plurality of parameters. That is, the tension computing process S84 preferably computes the tension of the cable using one or more parameters selected from the magnetic flux or the magnetic flux density, the remanent magnetization, the coercivity, the slope, or the like in the near-saturation magnetization region.

As described above, the tension measuring method according to this embodiment can compute the tension applied to the cable 30 from the measured magnetic flux, magnetic flux density, or the like. Further, in the tension measuring method according to this embodiment, it is necessary to prepare in advance the calibration curve used for computing the tension of the cable.

Figure 9:
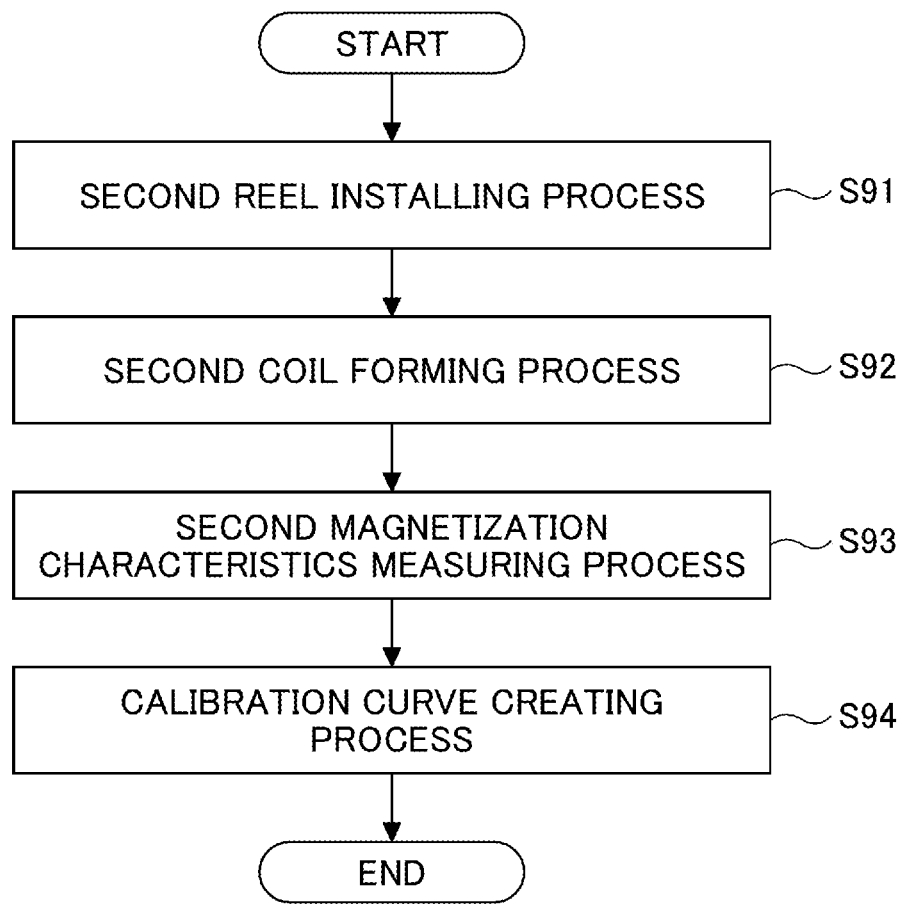
FIG. 9 is a flow chart for explaining a case where a calibration curve is created.

More particularly, the calibration curve may be created according to a flow chart 90 illustrated in FIG. 9, for example. In this case, the tension measuring method according to this embodiment may further include the following processes or steps.

[Second Reel Installing Process S91]

A second reel installing process S91 may install a tension measuring reel having a cylindrical solenoid coil forming part on a calibration cable to be measured.

[Second Coil Forming Process S92]

A second coil forming process S92 may wind a conductor around the solenoid coil forming part of the tension measuring reel, to form a second coil.

[Second Magnetization Characteristics Measuring Process S93]

A second magnetization characteristics measuring process S93 may generate a magnetic field by supplying a current to the second coil, and measure a hysteresis loop of the calibration cable.

[Calibration Curve Creating Process S94]

A calibration curve creating process S94 may create a calibration curve by forming a graph of a relationship between a tension of the calibration cable and magnetization characteristics of the calibration cable measured by the second magnetization characteristics measuring process S93.

In the second magnetization characteristics measuring process S94, the hysteresis loop can be measured at a plurality of different levels of tension applied to the calibration cable.

Next, each of the processes or steps S91 through S94 will be described in more detail.

[Second Reel Installing Process S91 and Second Coil Forming Process S92]

Because the second reel installing process S91 and the second coil forming process S92 can be performed in the same manner as the first reel installing process S81 and the first coil forming process S82, except that the calibration cable is used as the cable to be measured, a detailed description of the second reel installing process S91 and the second coil forming process S92 will be omitted. Further, after the second coil forming process S92, the tension measuring device having the same configuration as the tension measuring device 70 illustrated in FIG. 7 is obtained, except that the calibration cable is used as the measuring target in place of the cable 30.

The configuration of the second coil is not particularly limited, as long as the second coil can generate, around the calibration cable, a predetermined magnetic field required to create the calibration curve. For this reason, the number of turns of the conductor, and the material used for the conductor may be the same or may be different between the first coil which is formed in the first coil forming process S82, and the second coil which is formed in the second coil forming process S92.

However, because the measurement conditions at the time of creating the calibration curve and the measurement conditions at the time of measuring the measuring target are preferably the same, it is preferable that the first coil and the second coil have the same number of turns of conductors, material, or the like to be used.

[Second Magnetization Characteristics Measuring Process S94]

The second magnetization characteristics measuring process S93 may generate a magnetic field by supplying a current to the second coil, and magnetize the calibration cable. In this case, it is preferable to measure the intensity of the magnetic field generated near the calibration cable by the magnetic field sensor, to determine whether or not the generated magnetic field has a predetermined, desired magnetic field intensity. The current supplied to the second coil is preferably adjusted if the generated magnetic field intensity is deviated from the predetermined, desired magnetic field intensity.

In the second magnetization characteristics measuring process S93, the magnetic field of the second coil is varied so that the hysteresis loop includes a near-saturation magnetization region, and the hysteresis loop is measured from the magnetic field intensity, the magnetic flux, or the magnetic flux density inside the calibration cable, similar to the first magnetization characteristics measuring process S83 described above. By creating the hysteresis loop, it is possible to measure all parameters in the near-saturation magnetization region, such as the magnetic flux or the magnetic flux density, the remanent magnetization, the coercivity, the magnetic permeability, the hysteresis loss, or the like. When creating the hysteresis loop in the second magnetization characteristics measuring process S93, it is preferable to measure the hysteresis loop under the same conditions as those described for the first magnetization characteristics measuring process S83.

In the second magnetization characteristics measuring process S93, the hysteresis loop can be measured at a plurality of levels (or conditions) of tension applied to the calibration cable.

For this reason, before performing the second magnetization characteristics measuring process S93, it is preferable to apply, in advance, tensions to the calibration cable within a range up to a maximum value of the tension which is anticipated on being applied to the actual cable to be measured, to set the plurality of levels (or conditions) of tension at which the magnetization characteristics are to be measured.

In the second magnetization characteristics measuring process S93, the following tension applying process or step and hysteresis loop measuring process or step may be repeated alternately until the measurement at the plurality of levels of tension ends.

In the tension applying process, one level of tension, selected from the plurality of set levels, may be applied to the calibration cable. A predetermined tension may be applied to the calibration cable using a load cell, for example.

In the hysteresis loop measuring process, the hysteresis loop may be measured in a state where the tension applied to the calibration cable in the tension applying process is maintained. During the hysteresis loop measuring process, the tension applied to the calibration cable is maintained, and the tension is not varied.

The tension applying process and the hysteresis loop measuring process may be repeated until the measurement is performed at all levels of tension. Preferably, the hysteresis loop is measured a plurality of times at each level of tension. The accuracy of the calibration curve can be increased by measuring the hysteresis loop multiple times at each level of tension. When the hysteresis loop is measured multiple times at each level of tension as described above, it is preferable that the hysteresis loop measuring processes at the same level of tension are not performed in succession. In other words, when the hysteresis loop measuring process at a first level of tension is performed, the hysteresis loop measuring process at another, second level of tension is performed before the tension of the calibration cable is adjusted and the hysteresis loop measuring process at the first level of tension is performed again.

[Calibration Curve Creating Process S94]

The calibration curve creating process S94 may create the calibration curve by forming the graph of the relationship between the tension of the calibration cable and the magnetization characteristics of the calibration cable measured by the second magnetization characteristics measuring process S93.

The same tension measuring reel may be used for the first reel installing process S81 and the second reel installing process S91. For this reason, after the calibration curve creating process S94, the second coil used in the second reel installing process S91 and the second coil forming process S92 may be disassembled, and the removed tension measuring reel may be used in the first reel installing process S81.

The tension measuring method according to this embodiment can provide a novel tension measuring method which can measure the tension acting on the cable. In addition, the tension measuring method according to this embodiment can generate a uniform and stable magnetic field around the cable, which is the measuring target, by using a solenoid type magnetizer. Furthermore, the tension acting on the cable can be accurately measured, using one or more parameters selected from the magnetic flux or the magnetic flux density, the remanent magnetization, the coercivity, the magnetic permeability, the hysteresis loss, or the like in the near-saturation magnetization region, which have a strong correlation to the tension of the cable.

While the embodiments have been described, it will be understood that various variations, modifications, and substitutions may be made without departing from the spirit and scope of the present disclosure. Hence, combinations and substitutions of a part or all of each embodiment with another embodiment may be made, as appropriate.

What is claimed is:

1. A tension measuring method for measuring a tension of a cable, comprising:
    installing a tension measuring reel having a cylindrical solenoid coil forming part on the cable to be measured;
    forming a first coil by winding a conductor around the solenoid coil forming part to form a first coil;
    measuring a magnetic hysteresis loop of the cable by supplying a current to the first coil to generate a magnetic field; and
    computing the tension of the cable using a parameter determined from the magnetic hysteresis loop,
    wherein the solenoid coil forming part has a first through hole along a center axis thereof,
    wherein a magnetic field sensor and a magnetic flux sensor are provided inside the first through hole,
    wherein the installing installs the tension measuring reel on the cable so that the cable is positioned inside the first through hole,
    wherein the measuring varies the magnetic field so that the magnetic hysteresis loop includes a near-saturation magnetization region, to measure the magnetic hysteresis loop using the magnetic field sensor and the magnetic flux sensor, and
    wherein the parameter used by the computing is one or more parameters selected from a group consisting of a magnetic flux or a magnetic flux density, a remanent magnetization, a coercivity, a magnetic permeability, and a hysteresis loss in the near-saturation magnetization region.

2. The tension measuring method as claimed in claim 1, wherein
    the tension measuring reel is divisible into a plurality of members along a circumferential direction of the first through hole, and
    the installing disposes the plurality of members of the tension measuring reel along a circumferential direction of the cable.

3. The tension measuring method as claimed in claim 1, wherein
    the measuring measures the magnetic hysteresis loop a plurality of times, to obtain measured hysteresis loops, and
    the computing uses the parameter determined from hysteresis loops having the same shape, among the measured hysteresis loops, for computing the tension of the cable.

4. The tension measuring method as claimed in claim 1, wherein the computing computes the tension of the cable by a computing device which is input in advance with a relational expression of the magnetic field intensity and the magnetic flux or the magnetic flux density of the cable, versus the tension.

5. The tension measuring method as claimed in claim 1, wherein the computing computes the tension of the cable by a computing device which is input in advance with a calibration curve.

6. The tension measuring method as claimed in claim 5, further comprising:
    performing the installing, the forming, and the measuring with respect to a calibration cable to be measured; and
    creating the calibration curve from a magnetic hysteresis loop of the calibration cable, measured by the measuring with respect to the calibration cable, and a predetermined tension applied to the calibration cable during the measuring with respect to the calibration cable.

* * * * *